(12) United States Patent
Umamoto

(10) Patent No.: US 8,976,631 B2
(45) Date of Patent: Mar. 10, 2015

(54) TIMEPIECE COMPRISING SCALE FOR DENOTING BOTH TIME AND PHYSICAL QUANTITY

(75) Inventor: Eiichi Umamoto, Tokyo (JP)

(73) Assignee: Nihon Techno Co., Ltd., Tokyo (JP)

( * ) Notice: Subject to any disclaimer, the term of this patent is extended or adjusted under 35 U.S.C. 154(b) by 0 days.

(21) Appl. No.: 13/581,706

(22) PCT Filed: Aug. 23, 2011

(86) PCT No.: PCT/JP2011/068913
§ 371 (c)(1),
(2), (4) Date: Aug. 29, 2012

(87) PCT Pub. No.: WO2012/043096
PCT Pub. Date: Apr. 5, 2012

(65) Prior Publication Data
US 2013/0286793 A1    Oct. 31, 2013

(30) Foreign Application Priority Data

Oct. 2, 2010    (JP) .................................. 2010-224434

(51) Int. Cl.
*G04B 19/04*    (2006.01)
*G04G 9/00*    (2006.01)
(Continued)

(52) U.S. Cl.
CPC ............. *G04B 19/048* (2013.01); *G04G 9/0064* (2013.01); *G04G 21/02* (2013.01); *G01R 22/10* (2013.01); *G01R 11/56* (2013.01)
USPC ................................. 368/80; 368/11; 368/241

(58) Field of Classification Search
USPC .................. 368/11, 80, 223, 239–241, 82–84
See application file for complete search history.

(56) References Cited

U.S. PATENT DOCUMENTS 4,312,056 A * 1/1982 Nishimura ...................... 368/62
4,783,772 A * 11/1988 Umemoto et al. .............. 368/11
(Continued)

FOREIGN PATENT DOCUMENTS

CN    101482731 A    7/2009
CN    101495924 A    7/2009
(Continued)

OTHER PUBLICATIONS

International Search Report for PCT/JP2011/068913; Oct. 11, 2011.

*Primary Examiner* — Amy Cohen Johnson
*Assistant Examiner* — Matthew Powell
(74) *Attorney, Agent, or Firm* — Pearne & Gordon LLP

(57) ABSTRACT

With the conventional timepiece, when watching the timepiece at a casual glance, it has not been easy to comprehend the starting point of a physical quantity indicated at the present time by the timepiece, and the physical quantity at the present time. To solve the problem, a timepiece is provided, comprising; a dual-purpose scale, indicating time and a below-mentioned physical quantity; a driving unit for hand, driving a hand for pointing the dual-purpose scale according to time; an acquisition unit for physical quantity, acquiring information of the physical quantity from predetermined time designated as a starting point; and a driving unit for indicator of physical quantity, driving an indicator of physical quantity for indicating the acquired physical quantity on the dual-purpose scale, where a position on the dual-purpose scale pointed to by the hand at the predetermined time is designated as an original position for the physical quantity.

6 Claims, 31 Drawing Sheets

(51) Int. Cl.
*G04G 21/02* (2010.01)
*G01R 22/10* (2006.01)
*G01R 11/56* (2006.01)

(56) References Cited

U.S. PATENT DOCUMENTS

| | | | |
|---|---|---|---|
| 4,995,015 A * | 2/1991 | Chiang | 368/11 |
| 6,842,402 B2 * | 1/2005 | Germiquet et al. | 368/10 |
| 7,009,915 B2 * | 3/2006 | Brewer et al. | 368/71 |
| 7,269,100 B2 * | 9/2007 | Gilomen | 368/11 |
| 7,515,508 B1 * | 4/2009 | Stotz | 368/80 |
| 7,869,308 B2 * | 1/2011 | Rochat | 368/11 |
| 2004/0041570 A1 * | 3/2004 | Haeni et al. | 324/435 |
| 2004/0218472 A1 * | 11/2004 | Narayanaswami et al. | 368/10 |
| 2004/0233788 A1 * | 11/2004 | Plancon et al. | 368/11 |
| 2005/0041536 A1 * | 2/2005 | Lang | 368/223 |
| 2007/0183264 A1 * | 8/2007 | Raeber et al. | 368/11 |
| 2008/0225648 A1 * | 9/2008 | Kawaguchi | 368/66 |
| 2009/0185452 A1 | 7/2009 | Veuthey | |
| 2009/0201772 A1 * | 8/2009 | Billeaudeaux | 368/82 |
| 2010/0072974 A1 | 3/2010 | Uchida | |

FOREIGN PATENT DOCUMENTS

| | | |
|---|---|---|
| JP | 40-24716 B1 | 10/1965 |
| JP | 52-010172 A | 1/1977 |
| JP | 08-226982 A | 3/1996 |
| JP | 2000-193695 A | 7/2000 |
| JP | 2003-256967 A | 9/2003 |
| JP | 2009-085935 A | 4/2009 |
| JP | 2012-032306 A | 2/2012 |

* cited by examiner

Fig25

| Time division (Hour:minute) | Target level for physical quantity |
|---|---|
| 0:00 − 0:30 | 20kWh |
| 0:30 − 1:00 | 15kWh |
| 1:00 − 1:30 | 10kWh |
| 1:30 − 2:00 | 10kWh |
| ⋮ | ⋮ |
| 22:00 − 22:30 | 50kWh |
| 22:30 − 23:00 | 50kWh |
| 23:00 − 23:30 | 40kWh |
| 23:30 − 24:00 | 30kWh |

TIMEPIECE COMPRISING SCALE FOR DENOTING BOTH TIME AND PHYSICAL QUANTITY

BACKGROUND OF THE INVENTION

1. Field of the Invention

The present invention relates to a timepiece indicating both time and physical quantity.

2. Description of the Related Art

Conventionally, a timepiece that can display physical quantity in addition to time information irrespective of type such as a timepiece or a watch has been known.

For example, in the Patent Document 1, a digital timepiece for displaying target level, which can numerically display a current achievement for a target level to be achieved in a predetermined period of time, is disclosed. In the Patent Document 2, an analog countdown timepiece, which can numerically display remaining days until a specific target date, is disclosed.

RELATED ART DOCUMENTS

Patent Documents

Patent Document 1: Japanese Unexamined Patent Application Publication No. 2009-85935
Patent Document 2: Japanese Unexamined Patent Application Publication No. H8-226982

GENERAL DESCRIPTION OF THE INVENTION

Problems that the Invention Tries to Solve

However, in the conventional timepiece, when casually looking at the time indicated by the timepiece, it is not easy to grasp a starting time for additionally indicating the physical quantity and the physical quantity at current time. Therefore, especially for a child, it is difficult to have an interest in the physical quantity, and to efficiently utilize the physical quantity information.

Means for Solving the Problems

In order to solve the above problem, we provide a timepiece comprising a dual-purpose scale, indicating time and a below-mentioned physical quantity, a driving unit for hand, driving a hand for pointing the dual-purpose scale according to time, an acquisition unit for physical quantity, acquiring information of the physical quantity from predetermined time designated as a starting point, and a driving unit for indicator of physical quantity, driving an indicator of physical quantity for indicating the acquired physical quantity on the dual-purpose scale, where a position on the dual-purpose scale pointed to by the hand at the predetermined time is designated as an original position for the physical quantity.

Moreover, we provide a timepiece comprising a dual-purpose scale, indicating time and a below-mentioned physical quantity, a driving unit for hand, driving a hand pointing the dual-purpose scale according to time, an acquisition unit for physical quantity, acquiring information of the physical quantity from predetermined time designated as a starting point, a prediction unit for physical quantity, predicting the physical quantity at time after predetermined time passage from the predetermined time on a basis of the acquired information of the physical quantity, and a driving unit for indicator of predicted quantity, driving an indicator of predicted physical quantity for indicating the predicted physical quantity on the dual-purpose scale, where a position on the dual-purpose scale pointed to by the hand at the predetermined time is designated as an original position for the physical quantity.

Moreover, we provide a timepiece comprising a contrastive dual-purpose scale, indicating time and a below-mentioned physical quantity for a target level, a contrastive driving unit for hand, driving a hand for pointing the contrastive dual-purpose scale according to time, an acquisition unit for target level, acquiring a target level for the physical quantity in a time division by predetermined time unit, a contrastive acquisition unit for physical quantity, acquiring the physical quantity from starting time of the time division including current time to the current time at predetermined interval up to ending time of the time division including the current time, a contrastive indicator of physical quantity, indicating the physical quantity contrasted with the target level at the current time on the contrastive dual-purpose scale, the physical quantity acquired by the contrastive acquisition unit for physical quantity, and a driving unit for contrastive indicator of physical quantity, driving the contrastive indicator of physical quantity, where a position on the contrastive dual-purpose scale pointed to by the hand at the starting time of the time division including the current time is designated as an original position for the physical quantity contrasted with the target level, and where a position on the contrastive dual-purpose scale pointed to by the hand at the current time is designated as a position for the target level for the physical quantity at the current time.

Moreover, we provide a timepiece comprising a contrastive dual-purpose scale, indicating time and a below-mentioned physical quantity for a target level, a contrastive driving unit for hand, driving a hand for pointing the contrastive dual-purpose scale according to time, an acquisition unit for target level, acquiring a target level for the physical quantity in a time division by predetermined time unit, a contrastive acquisition unit for physical quantity, acquiring the physical quantity from starting time of the time division including current time to the current time at predetermined interval up to ending time of the time division including the current time, a contrastive prediction unit for physical quantity, predicting the physical quantity at ending time of the time division including the current time on a basis of the physical quantity acquired by the contrastive acquisition unit for physical quantity, a contrastive indicator of predicted physical quantity, indicating the predicted physical quantity contrasted with the target level at the ending time of the time division including the current time on the contrastive dual-purpose scale, the physical quantity predicted by the contrastive prediction unit for physical quantity, and a driving unit for contrastive indicator of predicted physical quantity, driving the contrastive indicator of predicted physical quantity, where a position on the contrastive dual-purpose scale pointed to by the hand at the starting time of the time division including the current time is designated as an original position for the physical quantity contrasted with the target level, and where a position on the contrastive dual-purpose scale pointed to by the hand at the ending time of the time division including the current time is designated as a position for the target level for the physical quantity at the ending time of the time division including the current time.

Effects of the Invention

According to the present invention having the above configuration, when casually looking at the time indicated by the timepiece, it is easy to grasp a starting time for the physical quantity and the physical quantity at current time.

BRIEF DESCRIPTION OF THE DRAWINGS

FIG. 25 is a diagram showing target level information to be acquired by an acquisition unit for target level.

DETAILED DESCRIPTION OF THE INVENTION

Figure 1:
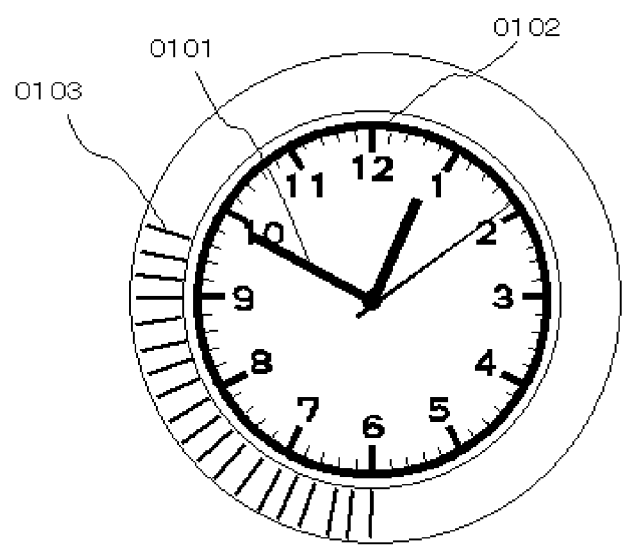
FIG. 1 is a schematic diagram showing a timepiece of a first embodiment.

Relationships between embodiments and claimed aspects are as follows. The first embodiment will mainly describe aspects 1 and 9. The second embodiment will mainly describe aspects 2 and 9. The third embodiment will mainly describe aspects 3 and 9. The fourth embodiment will mainly describe aspects 4 and 9. The fifth embodiment will mainly describe aspects 5 and 9. The sixth embodiment will mainly describe aspects 6 and 9. The seventh embodiment will mainly describe aspects 7 and 9. The eighth embodiment will mainly describe aspects 1 and 9. The first embodiment will mainly describe aspects 8 and 9. The ninth embodiment will mainly describe aspects 10, 11, 12, 15 and 16. The tenth embodiment will mainly describe aspects 13, 14, 15 and 16. The present invention is not to be limited to the above embodiments and able to be embodied in various forms without departing from the scope thereof.

First Embodiment

Concept of First Embodiment

FIG. 1 is a schematic diagram showing a timepiece of a first embodiment. As shown in FIG. 1, a 'timepiece' of the first embodiment has a configuration for driving an 'indicator of physical quantity' 0103 for indicating the physical quantity from 12:30 on a 'dual-purpose scale' 0102, where a position (30th scale mark) on the 'dual-purpose scale' 0102 pointed to by a 'minute hand' 0101 at 12:30 is designated as an original position for the physical quantity. According to the above configuration, when casually looking at the time indicated by the timepiece, it is easy to grasp a starting time for the physical quantity and the physical quantity at current time.

Configuration of First Embodiment

Figure 2:
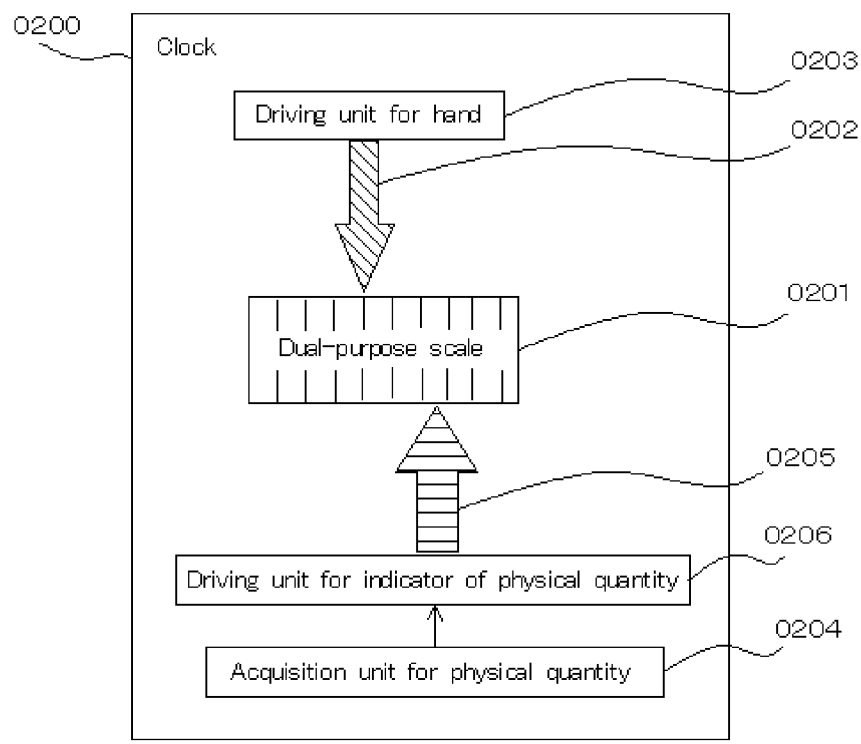
FIG. 2 is a functional block diagram of the timepiece of the first embodiment.

FIG. 2 is a functional block diagram of the timepiece of the first embodiment. As shown in FIG. 2, a 'timepiece' 0200 in the first embodiment comprises a 'dual-purpose scale' 0201, a 'hand' 0202, a 'driving unit for hand' 0203, a 'acquisition unit for physical quantity' 0204, an 'indicator of physical quantity' 0205, and a 'driving unit for indicator of physical quantity' 0206.

The 'dual-purpose scale' is for indicating time and a below-mentioned physical quantity. Therefore, one scale can indicate both time and physical quantity. It is mainly assumed that the dual-purpose scale is placed around the peripheral portion of a dial plate for indicating time as shown in FIG. 1, and it is not limited to this as long as time and physical quantity can be indicated. Similar to a general timepiece, it is assumed that the number of the scale marks is 60, and a multiple number may be used (e.g., 120), and a common divisor (e.g., 12) may be used.

Moreover, the physical quantity corresponding to a scale mark of the dual-purpose scale (e.g., proportion between the dual-purpose scale and the physical quantity) can be arbitrarily determined. As an example of the proportion between the dual-purpose scale and the physical quantity, the number of scale marks of the dual-purpose scale indicating a basic time unit (e.g., a scale mark) for a unit of physical quantity, which is expected to vary per unit time (e.g., 1 kWh), can be set. Moreover, the number of scale marks of the dual-purpose scale corresponding to a predetermined time division (e.g., 30 scale marks) for a target physical quantity in the predetermined time division (e.g., 5 kWh) can be set.

The 'driving unit for hand' is for driving a hand for pointing the dual-purpose scale according to time. Here, the hand means any one of an hour hand, a minute hand, or a second hand. This does not mean that no existences of an hour hand and a second hand even when a hand driven by the driving unit for hand is the minute hand. Moreover, a shape of the hand driven by the driving unit for hand is not necessarily an arrow, and may be any shape for pointing time on the dual-purpose scale. For example, a small light spot or an icon etc., which is indicated near the scale mark on the dual-purpose scale corresponding to time, may be utilized. An example of a driving means includes a step motor when the hand is physical object. Moreover, it is possible to output by utilizing the dial plate for indicating time as a display.

The 'acquisition unit for physical quantity' is for acquiring information of the physical quantity from predetermined time designated as a starting point. There are various physical quantities to be acquired. Examples of the physical quantity to be acquired include electric power consumption from a predetermined time, electric power generation from a predetermined time, sold electric power from a predetermined time, or purchased electric power from a predetermined time. Moreover, examples of the physical quantity to be acquired include running distance from a predetermined time, swimming distance from a predetermined time, number of steps from a predetermined time, number of push-ups from a predetermined time, or number of squats from a predetermined time. Examples are not limited to the above. Here, the predetermined time is not fixed. For example, when acquiring information of running distance from 12:15, and when the current time is 12:30, it is possible to newly acquire information of running distance from 12:30.

Examples of configurations for acquiring the physical quantity include a configuration for acquiring the physical quantity via a detector such as a temperature sensor or an acceleration sensor, a configuration for acquiring the physical quantity via wired or wireless communication line, or a configuration for acquiring the physical quantity via an operation input device.

Moreover, a configuration for acquiring the physical quantity by utilizing computation by internal processing device may be used. For example, information of latitude and longitude at a predetermined time and current time are acquired through a GPS receiver, thereby calculating distance from the predetermined time to the current time by the internal calculation process. Moreover, information of electric power consumption at a predetermined time and current time are acquired through a electric power consumption monitor, thereby calculating the electric power consumption from the predetermined time to the current time.

The 'driving unit for indicator of physical quantity' is for driving an indicator of physical quantity for indicating the acquired physical quantity on the dual-purpose scale, where a position on the dual-purpose scale to by the hand at the predetermined time is designated as an original position for the physical quantity. Here, the hand corresponds to a hand driven by the driving unit for hand, and to an hour hand, a minute hand, or a second hand.

For example, when the predetermined time is 5:15:30 pm, a scale mark of 15 minutes (15th scale mark) pointed to by the minute hand is designated as an original position for the physical quantity. Moreover, when indicating variation of the physical quantity at a second rate, a scale mark of 30 sec. (30th scale mark) pointed to by the second hand may be designated as an original position for the physical quantity, and when indicating variation of the physical quantity at an hour rate, a scale mark of 5 pm. (5th scale mark) pointed to by the hour hand may be designated as an original position for the physical quantity. In the above cases, the hands driven by the driving unit for hand respectively mean a second hand and an hour hand.

Figure 3:
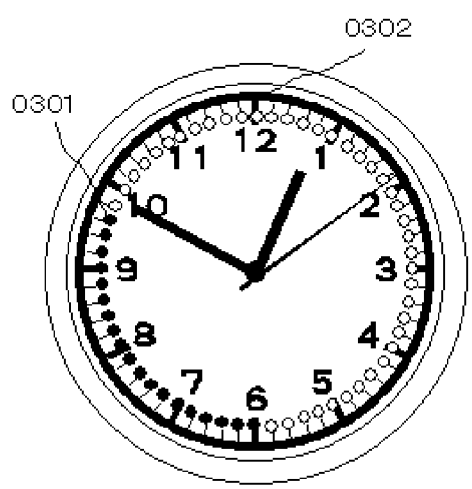
FIG. 3 is a diagram showing other timepiece 1 of the first embodiment.

The indicator of physical quantity may have a configuration as shown in FIG. 1, where luminescent elements are arranged corresponding to each position on the dual-purpose scale of the dial plate. In this case, according to physical quantity, the luminescent elements from the original position to a predetermined position may be lit up, or only the luminescent elements on the positions of the original position and the luminescent elements on the positions of the predetermined position may be lit up. Moreover, as a material of the luminescent element, LED element or EL element may be utilized. Moreover, as shown in FIG. 3, the luminescent element as the 'indicator of physical quantity' 0301 may be arranged on the inside of the dial plate corresponding to the 'dual-purpose scale' 0302, and may be arranged on the scale mark of the dual-purpose scale of the dial plate. Moreover, the indicator of physical quantity may be displayed by a display function.

Figure 4:
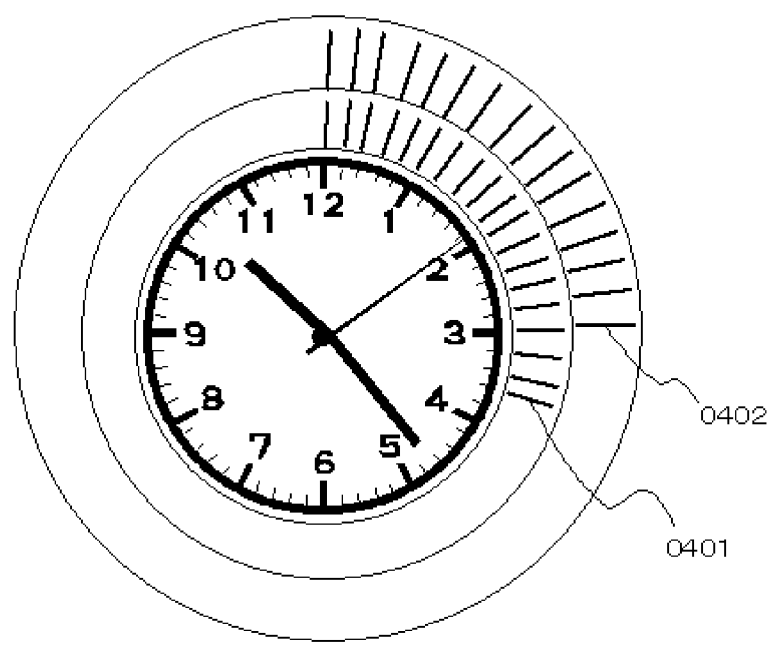
FIG. 4 is a diagram showing other timepiece 2 of the first embodiment.

Moreover, when indicating a plurality of physical quantities by utilizing the dual-purpose scale, a plurality of indicators of physical quantity may be installed in order to indicate the respective physical quantities on the dual-purpose scale. For example, as shown in FIG. 4, 'indicators A of physical quantity' 0401, circularly arranged on the outside of the dial plate, indicate the physical quantity 1, and 'indicators B of physical quantity' 0402, circularly arranged on the outside of the indicators, indicate the physical quantity 2. Moreover, when a physical quantity further exists, indicators of physical quantity, circularly arranged on the inside of the dial plate, can indicate the physical quantity. According to the above configuration, it is possible to grasp the plurality of physical quantities when looking at the timepiece.

Concrete Configuration of First Embodiment

Figure 5:
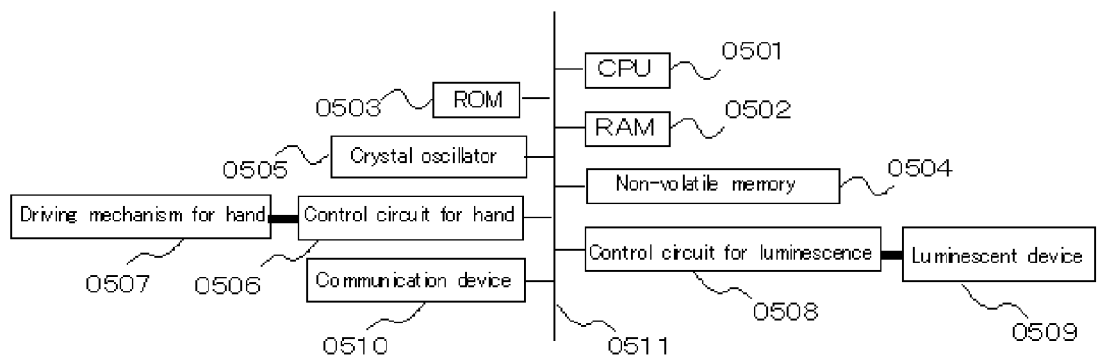
FIG. 5 is a diagram showing hardware configuration of the timepiece of the first embodiment.

FIG. 5 is a diagram showing hardware configuration of the timepiece of the first embodiment. Descriptions of the respective hardware components are provided with reference to FIG. 5.

As shown in FIG. 5, the timepiece comprises a 'CPU' 0501, a 'RAM' 0502, a 'ROM' 0503, a 'non-volatile memory' 0504, a 'crystal oscillator' 0505, a 'control circuit for hand' 0506, a 'driving mechanism for hand' 0507, a 'control circuit for luminescence' 0508, a 'luminescent device' 0509, and a 'communication device' 0510. This configuration is mutually connected through data communication path of a 'system bus' 0511, thereby carrying out transmission/reception and processing of information. Here, the luminescent device comprises a plurality of luminescent elements arranged near the respective scale marks of the dial plate.

The CPU transmits a control signal to the control circuit for hand at a predetermined timing on the basis of the signal from the crystal oscillator. The control circuit for hand receives the control signal, thereby controlling the hand through the driving mechanism for hand.

Subsequently, the CPU acquires the physical quantity information from a predetermined time through the communication device, and stores the information in the RAM. Subsequently, the CPU carries out a processing of designation of the position on the dual-purpose scale pointed to by the minute hand at the predetermined time as an original position for the physical quantity. Subsequently, the CPU determines number of the luminescent elements to be lit up according to the acquired physical quantity. Subsequently, the CPU outputs a control signal to light the determined number of the luminescent elements from the original position to the control circuit for luminescence. The control circuit for luminescence receives the control signal, and lights up the luminescent elements to be lit up.

Processing Flow of First Embodiment

Figure 6:
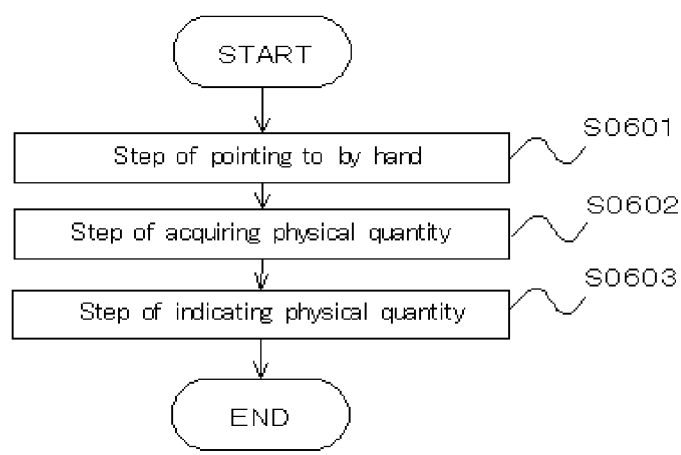
FIG. 6 is a flowchart of the timepiece of the first embodiment.

FIG. 6 is a flowchart of the timepiece of the first embodiment showing processing flow in the timepiece comprising a dual-purpose scale for indicating time and the physical quantity. The processing flow includes the following steps. At the outset, in a step S0601, a hand for pointing the dual-purpose scale according to time is driven (step of pointing by hand). Subsequently, in a step S0602, physical quantity from a predetermined time is acquired (step of acquiring physical quantity). In a step S0603, an indicator of physical quantity for indicating the acquired physical quantity on the dual-purpose scale, where a position on the dual-purpose scale pointed to by the hand at the predetermined time is designated as an original position for the physical quantity, is driven (step of indicating physical quantity).

Brief Description of Effects of First Embodiment

According to the above configuration of the timepiece of the first embodiment, when casually looking at the time indicated by the timepiece, it is easy to grasp a starting time for the physical quantity and the physical quantity at current time.

Second Embodiment

Concept of Second Embodiment

Figure 7:
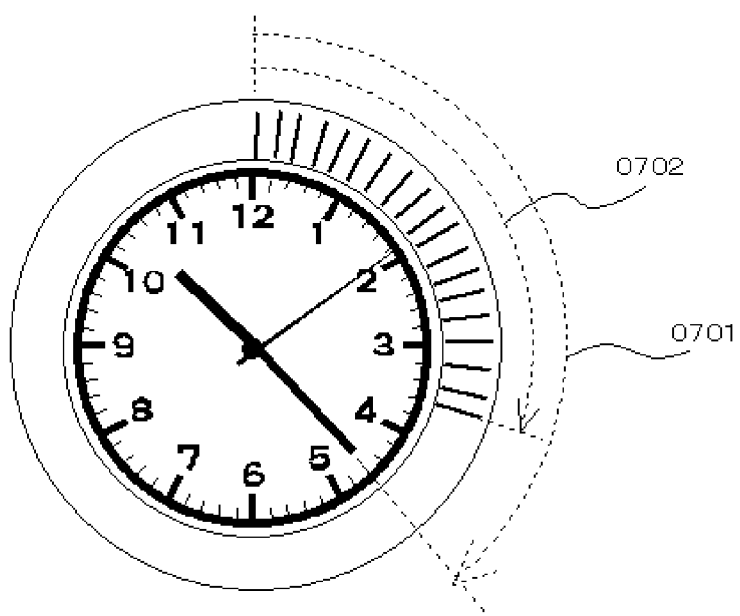
FIG. 7 is a schematic diagram showing a timepiece of a second embodiment.

A timepiece of a second embodiment is basically the same as the timepiece of the first embodiment. As shown in FIG. 7, the 'indicator of physical quantity' is driven at a proportion (proportion between the dual-purpose scale and the physical quantity), where a 'position (23rd scale mark)' 0701 on the 'dual-purpose scale' pointed to by the 'minute hand' at current time (10:23:09) indicates a 'target level' for the 'physical quantity at the current time (18th scale mark)' 0702. According this configuration, it is possible to easily grasp the physical quantity at current time contrasted with the target level for the physical quantity at the current time.

Configuration of Second Embodiment

Figure 8:
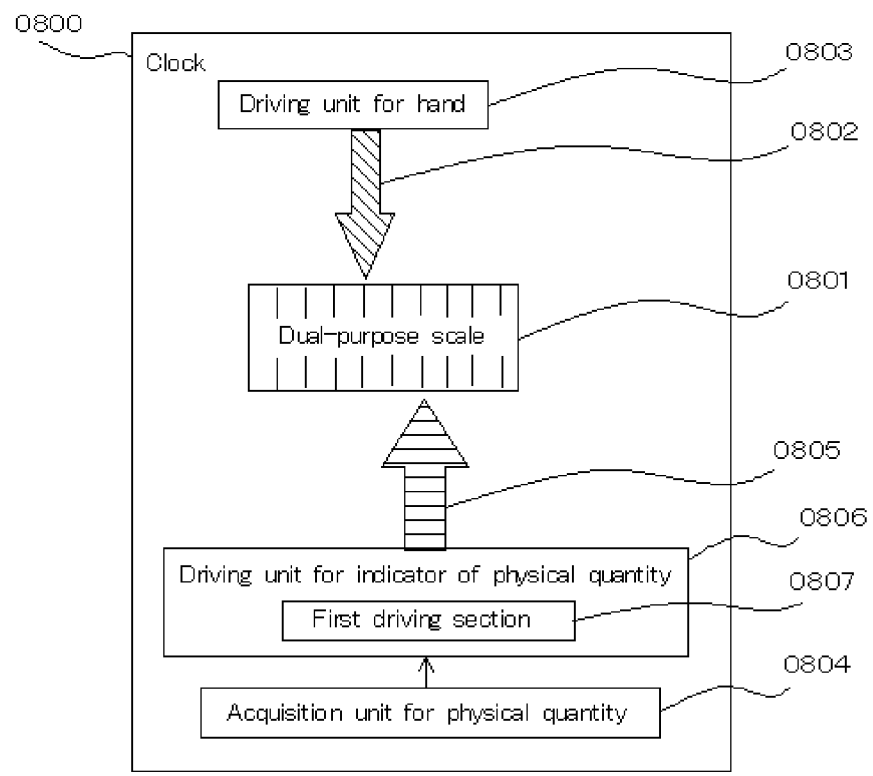
FIG. 8 is a functional block diagram of the timepiece of the second embodiment.

FIG. 8 is a functional block diagram of the timepiece of the second embodiment. As shown in FIG. 8, a 'timepiece' 0800 in the second embodiment comprises a 'dual-purpose scale' 0801, a 'hand' 0802, a 'driving unit for hand' 0803, an 'acquisition unit for physical quantity' 0804, an 'indicator of physical quantity' 0805, and a 'driving unit for indicator of physical quantity' 0806. The 'driving unit for indicator of physical quantity' further comprises a 'first driving section' 0807. Hereinafter, the first driving section, which is different from the first embodiment, will be described.

The 'first driving section' is for driving the indicator of physical quantity at a proportion, where a position on the dual-purpose scale pointed to by the hand at current time indicates a target level for the physical quantity at the current time.

As described in the first embodiment, the indicator of physical quantity is for indicating the acquired physical quantity on the dual-purpose scale. The acquired physical quantity can be easily understood by contrasting with the target level. Moreover, by making correspondence between the target level for the physical quantity at the current time and the position on the dual-purpose scale pointed to by the hand, it is possible to immediately grasp the physical quantity at current time contrasted with the target level by contrasting the hand and the indicator of physical quantity.

For example, when the target level of the electric power consumption from 6:00 to 6:30 is 60 kWh, it is possible to calculate a target level at an arbitrary time from 6:00 to 6:30. For example, the target level at 6:20 is 40 kWh. Here, when the real electric power consumption at 6:20 is 30 kWh, the real electric power consumption is ¾ of the target level. The indicator of physical quantity indicates the position of 15 min (15th scale mark) on the dual-purpose scale. Therefore, by the position of the indicator of physical quantity, it is possible to understand that the electric power consumption at 6:20 is ¾ of the target level for the electric power consumption.

The target level information utilized by the above driving section may be preliminarily stored in an internal storage, may be acquired from an external device through wired or wireless communication line, may be received as an input though an operation input device, or may be acquired through a storage device such as a USB memory. Moreover, calculation of a target level for physical quantity at one time on the basis of a target level for physical quantity at other time is included as the acquisition of target level.

Concrete Configuration of Second Embodiment

The hardware configuration of the second embodiment is basically the same as that of the first embodiment described with reference to FIG. 5. Hereinafter, processing, which is different from that in the first embodiment, will be described.

The CPU reads out the target level data for physical quantity in the respective time division stored in the non-volatile memory on the RAM. Subsequently, the target level for physical quantity at the current time is calculated on the basis of the target level data of the time division including the current time. For example, when the target level of the electric power consumption from 6:00 to 6:30 is 60 kWh, it is possible to calculate that a target level at 6:20 is 40 kWh.

Subsequently, the CPU calculates a proportion of physical quantity at the current time contrasted with the target level at the current time, and stores a result on the RAM. Subsequently, the CPU determines the luminescent elements to be lit up from the luminescent element, arranged on the original position of the dual-purpose scale, on the basis of the position on the dual-purpose scale as the original position for the physical quantity, the position on the dual-purpose scale pointed to by the minute hand at the current time, and the calculated proportion.

Processing Flow of Second Embodiment

Figure 9:
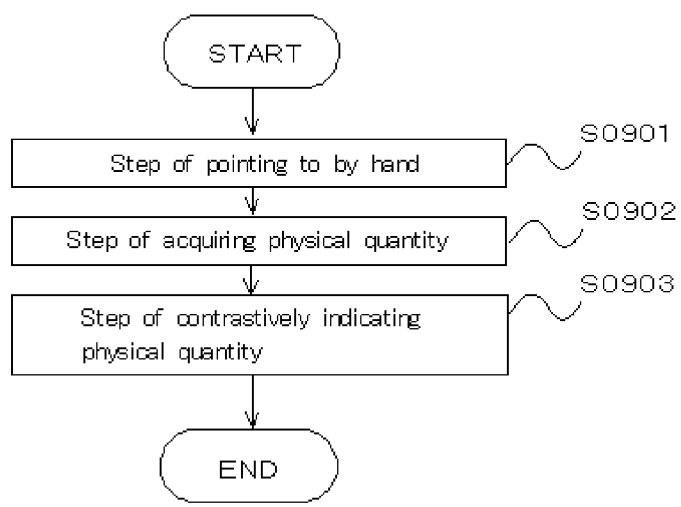
FIG. 9 is a flowchart of the timepiece of the second embodiment.

FIG. 9 is a flowchart of the timepiece of the second embodiment showing processing flow in the timepiece comprising a dual-purpose scale for indicating time and physical quantity. The processing flow includes the following steps. At the outset, in a step S0901, a hand for pointing the dual-purpose scale according to time is driven (step of pointing by hand). Subsequently, in a step S0902, physical quantity from a predetermined time is acquired (step of acquiring physical quantity). In a step S0903, an indicator of physical quantity for indicating the acquired physical quantity on the dual-purpose scale, where a position on the dual-purpose scale pointed to by the hand at the predetermined time is designated as an original position for the physical quantity, and where a position on the dual-purpose scale pointed to by the hand at current time indicates a target level for the physical quantity at the current time, is driven (step of contrastively indicating physical quantity).

Brief Description of Effects of Second Embodiment

According to the timepiece of the second embodiment, in addition to the effect of the first embodiment, it is possible to easily grasp the physical quantity at current time contrasted with the target level for the physical quantity at the current time.

Third Embodiment

Concept of Third Embodiment

A timepiece of a third embodiment is basically the same as the timepiece of the second embodiment, and it is possible to control color of the indicator of physical quantity according to the determination as to whether a position indicated by the indicator of physical quantity is larger than the position on the dual-purpose scale for indicating the target level. According to this configuration, it is possible to easily grasp whether the physical quantity is larger than the target level.

Configuration of Third Embodiment

Figure 10:
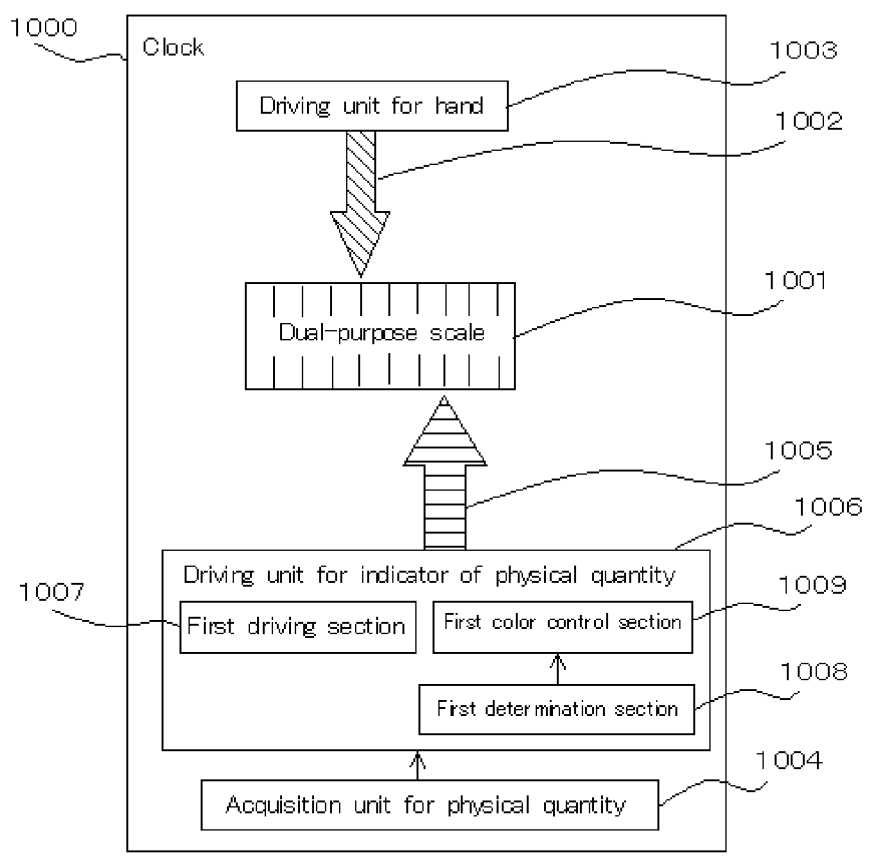
FIG. 10 is a functional block diagram of the timepiece of the third embodiment.

FIG. 10 is a functional block diagram of the timepiece of the third embodiment. As shown in FIG. 10, a 'timepiece' 1000 in the third embodiment comprises a 'dual-purpose scale' 1001, a 'hand' 1002, a 'driving unit for hand' 1003, an 'acquisition unit for physical quantity' 1004, an 'indicator of physical quantity' 1005, and a 'driving unit for indicator of physical quantity' 1006. The 'driving unit for indicator of physical quantity' further comprises a 'first driving section' 1007, a 'first determination section' 1008, and a 'first color control section' 1009. Hereinafter, the first determination section and the first color control section, which are different from the first and second embodiments, will be described.

The 'first determination section' is for determining whether a position indicated by the indicator of physical quantity is larger than the position on the dual-purpose scale for indicating the target level.

The 'first color control section' is for controlling color of the indicator of physical quantity according to the determination by the first determination section. This control can be carried out on the basis of data (e.g. table data), where the determination by a determination section for standard for hand and the color of the indicator of physical quantity are correlated.

Concrete Configuration of Third Embodiment

The hardware configuration of the third embodiment is basically the same as that of the first embodiment described with reference to FIG. 5. Hereinafter, processing, which is different from those in the first to third embodiments, will be described.

The CPU carries out determination as to whether the position indicated by the indicator of physical quantity is larger than the position on the dual-purpose scale for indicating the target level by contrasting the target level value at the current time with the physical quantity value, and stores a result in the RAM.

Moreover, the CPU reads out table data, where the determination result (large or not) stored in the ROM and the color of the indicator of physical quantity are correlated, on the RAM, thereby determining the color of the indicator of physical quantity on the basis of the result and the table data.

Moreover, the CPU outputs a signal to designate the color of the indicator of physical quantity to the control circuit for luminescence. The control circuit for luminescence receives the signal to designate the color, thereby controlling the color of the luminescent element.

Processing Flow of Third Embodiment

Figure 11:
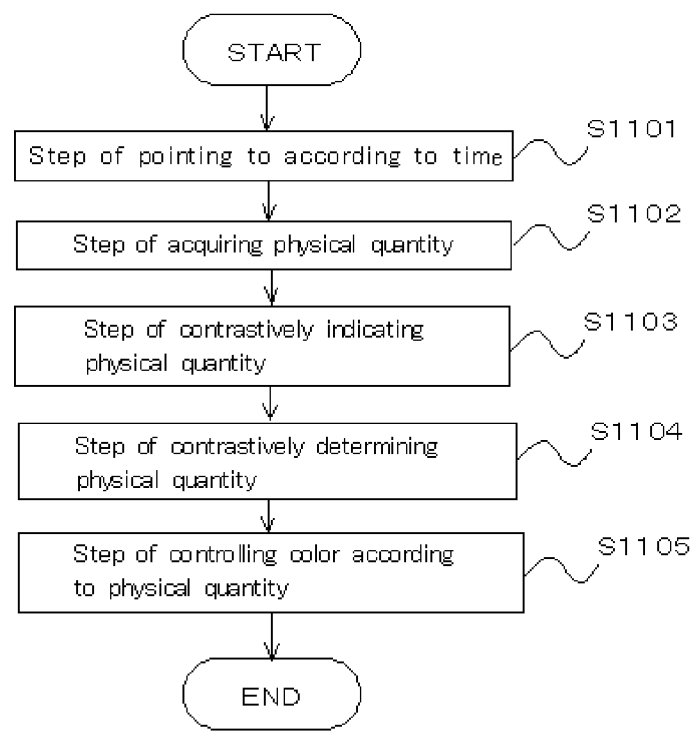
FIG. 11 is a flowchart of the timepiece of the third embodiment.

FIG. 11 is a flowchart of the timepiece of the third embodiment showing processing flow in the timepiece comprising a dual-purpose scale for indicating time and physical quantity. The processing flow includes the following steps. At the outset, in a step S1101, a hand for pointing the dual-purpose scale according to time is driven (step of pointing by time). Subsequently, in a step S1102, physical quantity from a predetermined time is acquired (step of acquiring physical quantity). In a step S1103, an indicator of physical quantity for indicating the acquired physical quantity on the dual-purpose scale, where a position on the dual-purpose scale pointed to by the hand at the predetermined time is designated as an original position for the physical quantity, and where a position on the dual-purpose scale pointed to by the hand at current time indicates a target level for the physical quantity at the current time, is driven (step of contrastively indicating physical quantity). Subsequently, in a step S1104, it is determined whether the position indicated by the indicator of physical quantity is larger than the position on the dual-purpose scale for indicating the target level (step of contrastively determining physical quantity). Subsequently, in a step S1105, the color of the indicator of physical quantity is controlled according to the determination by the step of contrastively determining physical quantity.

Brief Description of Effects of Third Embodiment

According to the timepiece of the second embodiment, in addition to the effects of the first and second embodiments, it is possible to intuitively grasp whether the physical quantity is larger than the target level by variation of the color of the indicator of physical quantity.

Fourth Embodiment

Concept of Fourth Embodiment

Figure 12:
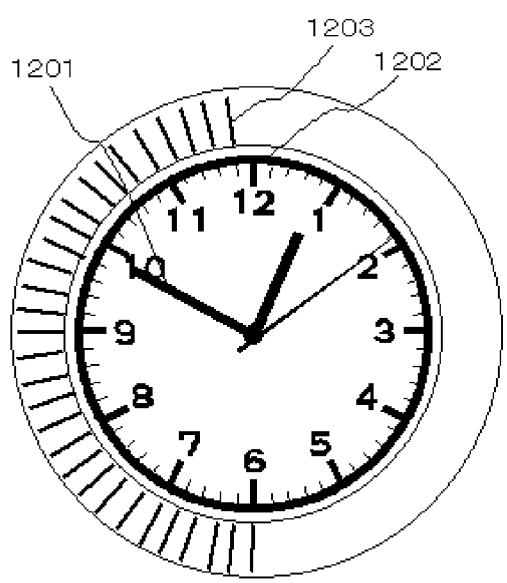
FIG. 12 is a schematic diagram showing a timepiece of a fourth embodiment.

FIG. 12 is a schematic diagram showing a timepiece of the fourth embodiment. As shown in FIG. 12, a 'timepiece' of the fourth embodiment has a configuration for driving an 'indicator of predicted physical quantity' 1203 for indicating the physical quantity, which is predicted to be acquired at 13:00, on a 'dual-purpose scale' 1202, where a position (30th scale mark) on the 'dual-purpose scale' 1202 pointed to by a 'minute hand' 1201 at 12:30 is designated as an original position for the physical quantity. According to the above configuration, when casually looking at the time indicated by the timepiece, it is easy to grasp a starting time for the predicted physical quantity and the predicted physical quantity at a later time.

Configuration of Fourth Embodiment

Figure 13:
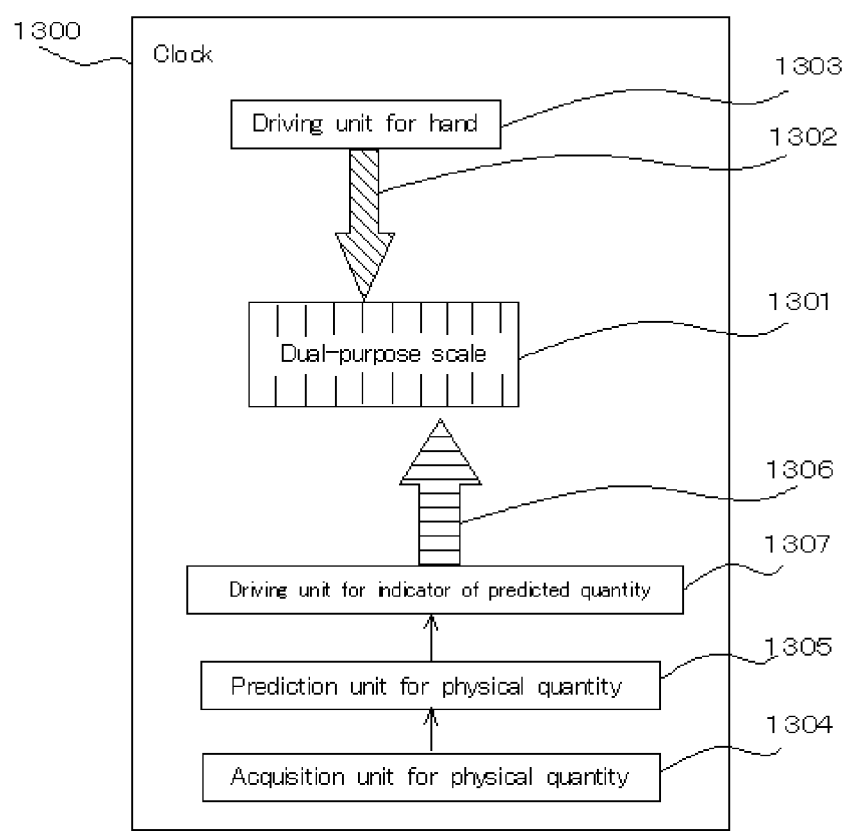
FIG. 13 is a functional block diagram of the timepiece of the fourth embodiment.

FIG. 13 is a functional block diagram of the timepiece of the fourth embodiment. As shown in FIG. 13, a 'timepiece'

1300 in the fourth embodiment comprises a 'dual-purpose scale' 1301, a 'hand' 1302, a 'driving unit for hand' 1303, an 'acquisition unit for physical quantity' 1304, a prediction unit for physical quantity' 1305, an 'indicator of predicted physical quantity' 1306, and a 'driving unit for indicator of predicted physical quantity' 1307. Hereinafter, the prediction unit for physical quantity and the driving unit for indicator of predicted physical quantity, which are different from the first to third embodiments, will be described.

The 'prediction unit for physical quantity' is for predicting the physical quantity at a time after predetermined time passage from the predetermined time on a basis of the acquired information of the physical quantity. Here, as an example of the time after predetermined time passage, ending time of the time division including current time (e.g., 13:00 in the time division from 12:30 to 13:00) may be used, and it is not limited to this example.

For example, the electric power consumption until the time after a predetermined time passage on the basis of the electric power consumption generated from the predetermined time to the current time can be predicted. Specifically, fitting of variation of the physical quantity from the predetermined time to the current time by linear function or multidimensional function is carried out, thereby predicting the physical quantity at the time after the predetermined time passage. For example, when electric power of 5 kWh is generated from 3:00 to 3:15, fitting by the linear function is carried out, and it is predicted that 10 kWh electric power is generated until 3:30. When 1 kWh electric power is generated from 3:00 to 3:10, and 4 kWh electric power is generated from 3:00 to 3:20, fitting by the quadratic function is carried out, it is predicted that 9 kWh electric power is generated until 3:30. Moreover, it is possible to carry out fitting by high-dimensional function by further utilizing the physical quantity data from a predetermined time to current time, thereby predicting the physical quantity at time after predetermined time passage.

The 'driving unit for indicator of predicted quantity' is for driving an indicator of predicted physical quantity for indicating the predicted physical quantity on the dual-purpose scale, where a position on the dual-purpose scale pointed to by the hand at the predetermined time is designated as an original position for the physical quantity.

The other configuration of the indicator of predicted physical quantity is the same as that of the indicator of physical quantity. Moreover, a configuration, where both indicator of predicted physical quantity and indicator of physical quantity are provided, may be used.

For example, the indicator of predicted physical quantity is placed in the outside of the dial plate, and the indicator of physical quantity is placed in the inside of the dial plate. According to this configuration, it is possible to immediately grasp the physical quantity at the current time and the physical quantity at time after predetermined time passage.

Concrete Configuration of Fourth Embodiment

The hardware configuration of the fourth embodiment is basically the same as that of the first embodiment described with reference to FIG. 5.

The CPU transmits a control signal to the control circuit for hand at a predetermined timing on the basis of the signal from the crystal oscillator. The control circuit for hand receives the control signal, thereby controlling the hand through the driving mechanism for hand.

Subsequently, the CPU acquires the physical quantity information from a predetermined time through the communication device, and stores the information in the RAM. Subsequently, the CPU carries out a processing of designation of the position on the dual-purpose scale pointed to by the minute hand at the predetermined time as an original position for the physical quantity. Subsequently, on the basis of the acquired physical quantity data, fitting of variation of the physical quantity from the predetermined time to the current time by function is carried out, thereby calculating the physical quantity at the time after the predetermined time passage, and stores a result in the RAM. Subsequently, the CPU determines the number of luminescent elements to be lit up according to the acquired physical quantity. Subsequently, the CPU outputs a control signal to light the determined number of the luminescent elements from the original position to the control circuit for luminescence. The control circuit for luminescence receives the control signal, and lights up the luminescent elements to be lit up.

Processing Flow of Fourth Embodiment

Figure 14:
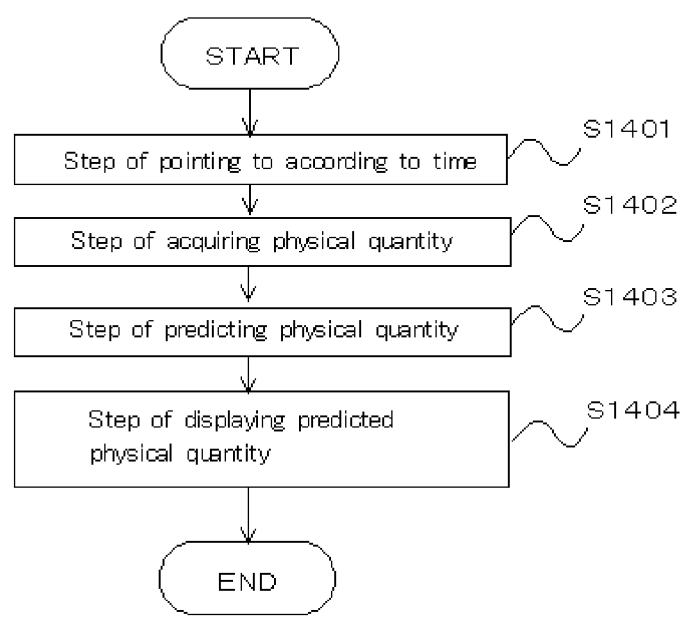
FIG. 14 is a flowchart of the timepiece of the fourth embodiment.

FIG. 14 is a flowchart of the timepiece of the fourth embodiment showing processing flow in the timepiece comprising a dual-purpose scale for indicating time and physical quantity. The processing flow includes the following steps. At the outset, in a step S1401, the dual-purpose scale is pointed to by a hand according to time (step of pointing according to time). Subsequently, in a step S1402, physical quantity from a predetermined time is acquired (step of acquiring physical quantity). In a step S1403, the physical quantity at time after predetermined time passage from the predetermined time is predicted on a basis of the acquired information of the physical quantity (step of predicting physical quantity). In a step S1404, the indicator of predicted physical quantity for indicating the predicted physical quantity on the dual-purpose scale, where a position on the dual-purpose scale pointed to by the hand at the predetermined time is designated as an original position for the physical quantity, is driven (step of indicating predicted physical quantity).

Brief Description of Effects of Fourth Embodiment

According to the timepiece of the fourth embodiment, when casually looking at the time indicated by the timepiece, it is easy to grasp a starting time for the physical quantity and the physical quantity at time after predetermined time passage.

Fifth Embodiment

Concept of Fifth Embodiment

Figure 15:
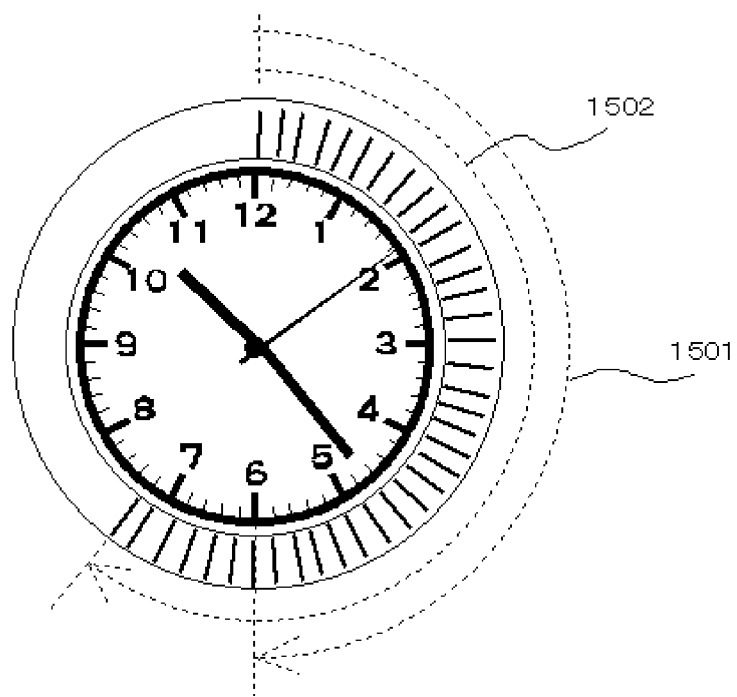
FIG. 15 is a schematic diagram showing a timepiece of a fifth embodiment.

A timepiece of a fifth embodiment is basically the same as the timepiece of the fourth embodiment. As shown in FIG. 15, the 'indicator of physical quantity' is driven at a proportion (proportion between the dual-purpose scale and the physical quantity), where a 'position (30th scale mark)' 1501 on the 'dual-purpose scale' pointed to by the 'minute hand' at time after a predetermined time passage (after 30 minutes) from a predetermined time as an original position for the physical quantity (10:00) indicates a 'target level' for the 'physical quantity at the time after the predetermined time passage (36th scale mark)' 1502. According to this configuration, it is possible to easily grasp the predicted physical quantity at a later time contrasted with the target level for the physical quantity at a later time.

Configuration of Fifth Embodiment

Figure 16:
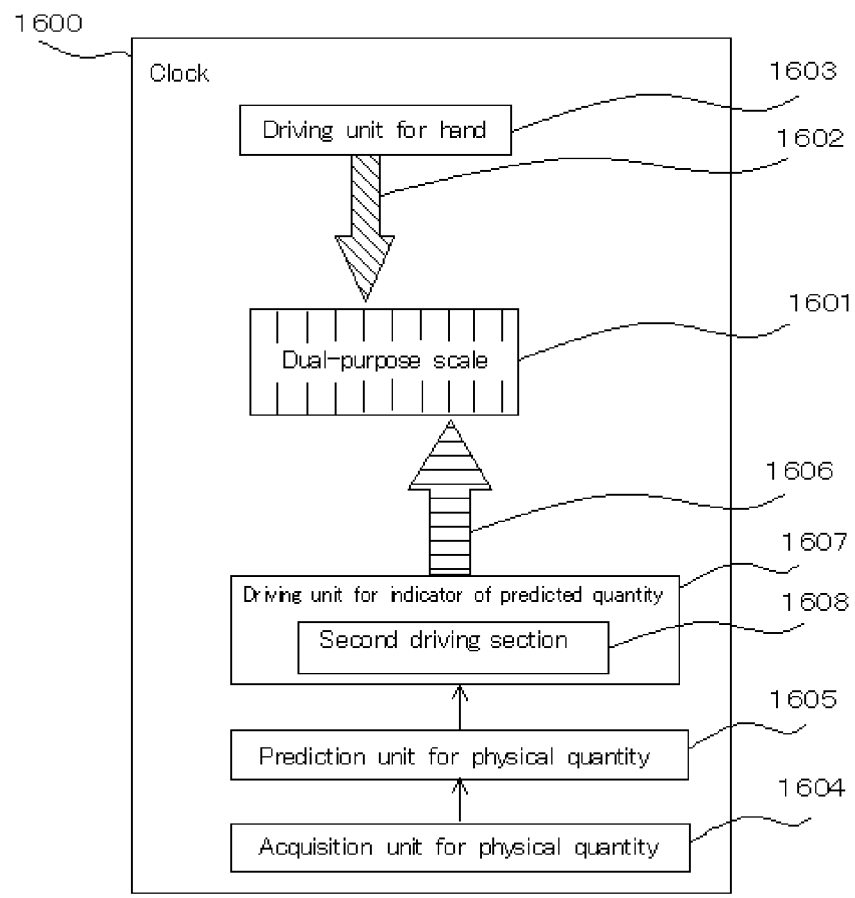
FIG. 16 is a functional block diagram of the timepiece of the fifth embodiment.

FIG. 16 is a functional block diagram of the timepiece of the fifth embodiment. As shown in FIG. 16, a 'timepiece'

1600 in the fifth embodiment comprises a 'dual-purpose scale' 1601, a 'hand' 1602, a 'driving unit for hand' 1603, an 'acquisition unit for physical quantity' 1604, a 'prediction unit for physical quantity' 1605 an 'indicator of predicted physical quantity' 1606, and a 'driving unit for indicator of predicted physical quantity' 1607. The 'driving unit for indicator of predicted physical quantity' further comprises a 'second driving section' 1608. Hereinafter, the second driving section, which is different from the first to fourth embodiments, will be described.

The 'second driving section' is for driving the indicator of predicted physical quantity at a proportion, where a position on the dual-purpose scale pointed to by the hand at the time after the predetermined time passage indicates a target level for the physical quantity at the time after the predetermined time passage.

As described in the fourth embodiment, the indicator of predicted physical quantity is for indicating the predicted physical quantity on the dual-purpose scale, where a position on the dual-purpose scale pointed to by the hand at the predetermined time is designated as an original position for the physical quantity. The predicted physical quantity can be easily understood by contrasting with the target level at the time after the predetermined time passage. Moreover, by making correspondence between the target level for the physical quantity at the time after the predetermined time passage and the position on the dual-purpose scale pointed to by the hand at the time after the predetermined time passage, it is possible to immediately grasp the predicted physical quantity at the later time contrasted with the target level by contrasting the position on the dual-purpose scale and the indicator of predicted physical quantity.

For example, when the target level of the electric power consumption from 6:00 to 6:30 is 60 kWh, it is possible to calculate a target level at an arbitrary time from 6:00 to 6:30. For example, the target level at 6:20 is 40 kWh. When the electric power consumption from 6:00 to 6:15 is 20 kWh, fitting by the linear function is carried out, and it is predicted that 40 kWh electric power is consumed until 3:30. Here, since the position (30th scale mark) on the dual-purpose scale pointed to by the minute hand at 6:30 corresponds to 60 kWh as the target level, the indicator of predicted physical quantity indicates the 20th scale mark on the dual-purpose scale, which indicates 40 kWh, by the scope of lighting up. Therefore, by the position of the indicator of predicted physical quantity, it is possible to understand that the electric power consumption at 6:30, which is predicted at 6:15, is ⅔ of the target level for the electric power consumption.

The target level information after a predetermined time passage utilized by the above second driving section may be acquired from an external device through wired or wireless communication line, may be received as an input through an operation input device, or may be acquired through a storage device such as a USB memory. Moreover, calculation of a target level for physical quantity at one time on the basis of a target level for physical quantity at other time is included as the acquisition of target level.

Concrete Configuration of Fifth Embodiment

The hardware configuration of the fifth embodiment is basically the same as that of the first embodiment described with reference to FIG. 5. Hereinafter, processing, which is different from that in the fourth embodiment, will be described.

The CPU reads out the target level data for physical quantity at ending time in the respective time division stored in the non-volatile memory on the RAM. Subsequently, the CPU calculates the predicted physical quantity to be acquired at the ending time in the time division including the current time. Subsequently, the CPU calculates a proportion of physical quantity at the ending time contrasted with the target level at the ending time, and stores a result on the RAM. Subsequently, the CPU determines the luminescent elements to be lit up from the luminescent element, arranged on the original position of the dual-purpose scale, on the basis of the position on the dual-purpose scale as the original position for the physical quantity, the position on the dual-purpose scale pointed to by the minute hand at the ending time, and the calculated proportion.

Processing Flow of Fifth Embodiment

Figure 17:
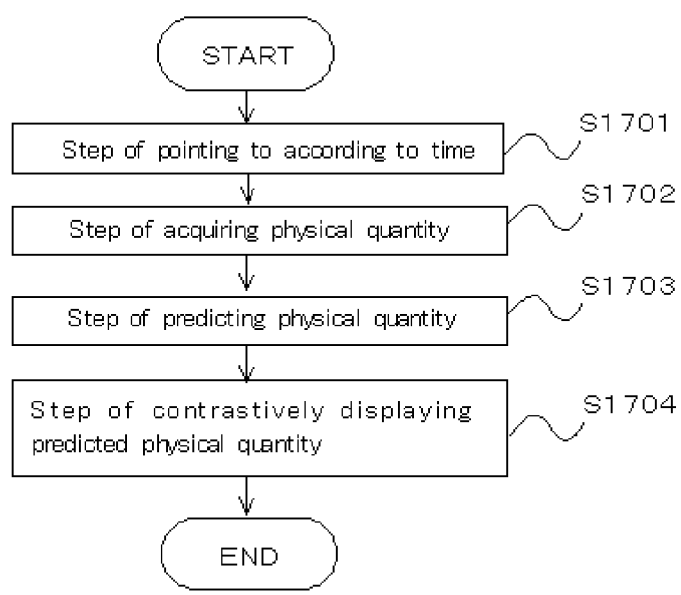
FIG. 17 is a flowchart of the timepiece of the fifth embodiment.

FIG. 17 is a flowchart of the timepiece of the fifth embodiment showing processing flow in the timepiece comprising a dual-purpose scale for indicating time and the physical quantity. The processing flow includes the following steps. At the outset, in a step S1701, the dual-purpose scale is pointed to by a hand according to time (step of pointing according to time). Subsequently, in a step S1702, physical quantity from a predetermined time is acquired (step of acquiring physical quantity). In a step S1703, the physical quantity at a time after predetermined time passage from the predetermined time is predicted on a basis of the acquired information of the physical quantity (step of predicting physical quantity). In a step S1704, the indicator of predicted physical quantity for indicating the predicted physical quantity on the dual-purpose scale, where a position on the dual-purpose scale pointed to by the hand at the predetermined time is designated as an original position for the physical quantity, is driven at the proportion, where the position on the dual-purpose scale pointed to by the hand at the time after the predetermined time passage indicates the target level for the physical quantity at the time after the predetermined time passage (step of contrastively indicating predicted physical quantity).

Brief Description of Effects of Fifth Embodiment

According to the timepiece of the fifth embodiment, in addition to the effect of the fourth embodiment, it is possible to easily grasp the predicted physical quantity at the later time contrasted with the target level for the physical quantity at the later time.

Sixth Embodiment

Concept of Sixth Embodiment

A timepiece of a sixth embodiment is basically the same as the timepiece of the fifth embodiment, and it is possible to control color of the indicator of physical quantity according to the determination as to whether a position indicated by the indicator of predicted physical quantity is larger than the position on the dual-purpose scale for indicating the target level. According to this configuration, it is possible to easily grasp whether the predicted physical quantity is larger than the target level.

Configuration of Sixth Embodiment

Figure 18:
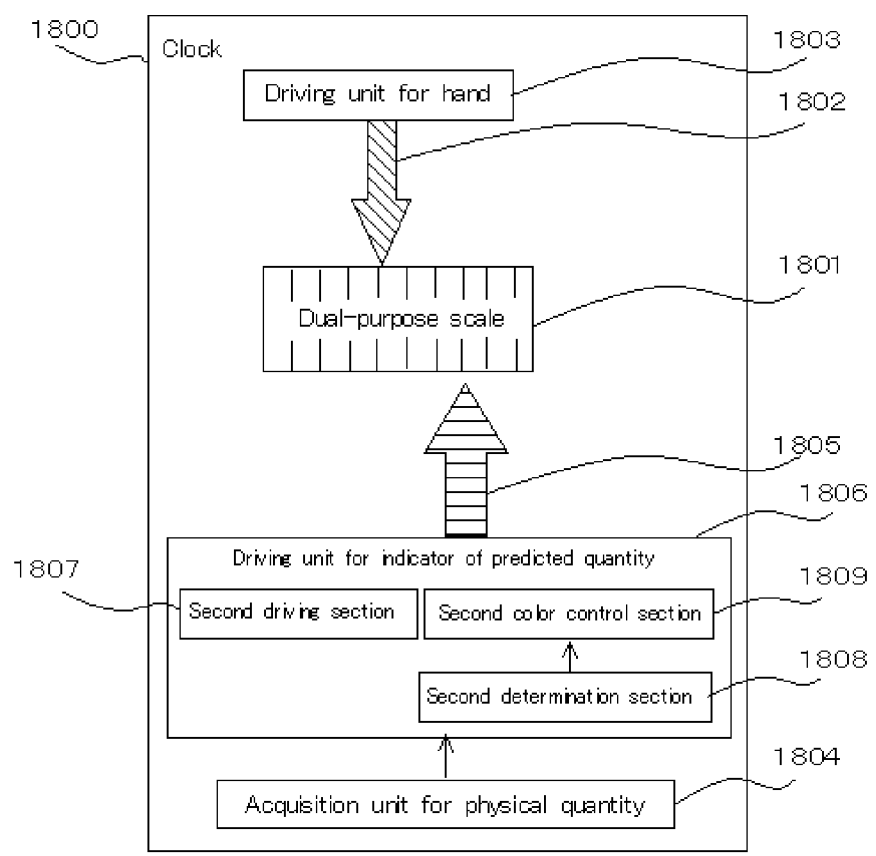
FIG. 18 is a functional block diagram of the timepiece of a sixth embodiment.

FIG. 18 is a functional block diagram of the timepiece of the sixth embodiment. As shown in FIG. 18, a 'timepiece' 1800 in the sixth embodiment comprises a 'dual-purpose scale' 1801, a 'hand' 1802, a 'driving unit for hand' 1803, an 'acquisition unit for physical quantity' 1804, a 'prediction unit for physical quantity' 1805 an 'indicator of predicted physical quantity' 1806, and a 'driving unit for indicator of predicted physical quantity' 1807. The 'driving unit for indicator of predicted physical quantity' further comprises a 'second driving section' 1808, a 'second determination section' 1809, and a 'second color control section' 1810. Hereinafter, the 'second determination section', and the 'second color control section', which are different from the first to fifth embodiments, will be described.

The 'second determination section' is for determining whether a position indicated by the indicator of predicted physical quantity is larger than the position on the dual-purpose scale for indicating the target level.

The 'second color control section' is for controlling color of the indicator of predicted physical quantity according to the determination by the second determination section. This control can be carried out on the basis of data (e.g. table data), where the determination to be outputted by the second determination section and the color of the indicator of predicted physical quantity are correlated.

Concrete Configuration of Sixth Embodiment

The hardware configuration of the sixth embodiment is basically the same as that of the first embodiment described with reference to FIG. 5. Hereinafter, processing, which is different from those in the fourth and fifth embodiments, will be described.

The CPU carries out determination as to whether the position indicated by the indicator of predicted physical quantity is larger than the position on the dual-purpose scale for indicating the target level by contrasting the target level value at the time after the predetermined time passage with the predicted physical quantity value, and stores a result in the RAM.

Moreover, the CPU reads out table data, where the determination result (large or not) stored in the ROM and the color of the indicator of predicted physical quantity are correlated, on the RAM, thereby determining the color of the predicted indicator of physical quantity on the basis of the result and the table data.

Moreover, the CPU outputs a signal to designate the color of the indicator of predicted physical quantity to the control circuit for luminescence. The control circuit for luminescence receives the signal to designate the color, thereby controlling the color of the luminescent element.

Processing Flow of Sixth Embodiment

Figure 19:
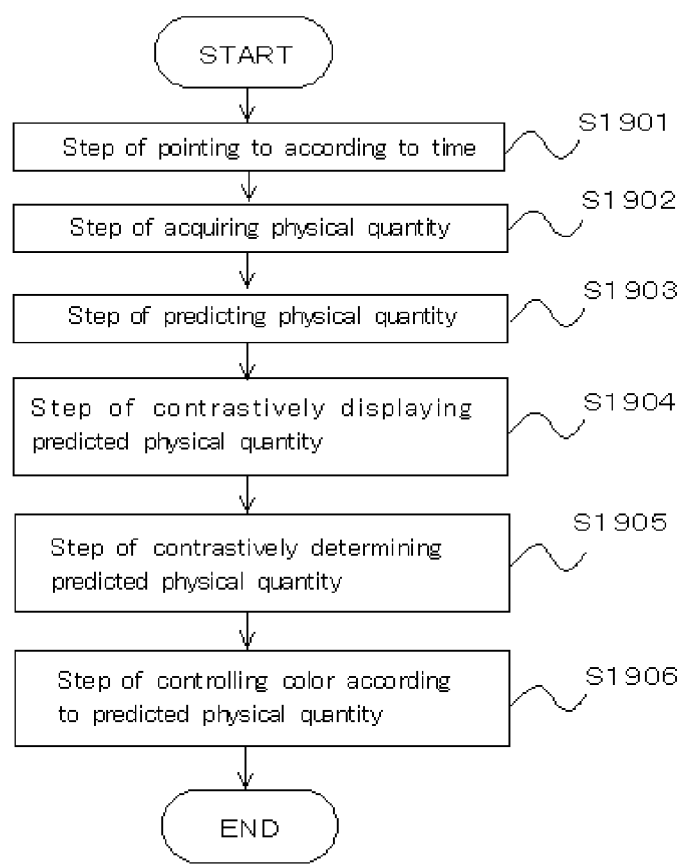
FIG. 19 is a flowchart of the timepiece of the sixth embodiment.

FIG. 19 is a flowchart of the timepiece of the sixth embodiment showing the processing flow in the timepiece comprising a dual-purpose scale for indicating time and the physical quantity. The processing flow includes the following steps. At the outset, in a step S1901, the dual-purpose scale is pointed to by a hand according to time (step of pointing according to time). Subsequently, in a step S1902, physical quantity from a predetermined time is acquired (step of acquiring physical quantity). In a step S1903, the physical quantity at time after predetermined time passage from the predetermined time is predicted on a basis of the acquired information of the physical quantity (step of predicting physical quantity). In a step S1904, the indicator of predicted physical quantity for indicating the predicted physical quantity on the dual-purpose scale, where a position on the dual-purpose scale pointed to by the hand at the predetermined time is designated as an original position for the physical quantity, is driven at the proportion, where the position on the dual-purpose scale pointed to by the hand at the time after the predetermined time passage indicates the target level for the physical quantity at the time after the predetermined time passage (step of contrastively indicating predicted physical quantity). In a step S1905, it is determined whether the position indicated by the indicator of predicted physical quantity is larger than the position on the dual-purpose scale for indicating the target level (step of contrastively determining predicted physical quantity). In a step S1906, color of the indicator of predicted physical quantity is controlled according to the determination by the second determination section (step of controlling color according to predicted physical quantity).

Brief Description of Effects of Sixth Embodiment

According to the timepiece of the sixth embodiment, in addition to the effect of the fifth embodiment, it is possible to easily grasp the predicted physical quantity contrasted with the target level by variation of color of the indicator of predicted physical quantity.

Seventh Embodiment

Concept of Seventh Embodiment

In a timepiece of a seventh embodiment, the acquisition unit for physical quantity acquires electric power consumption from the predetermined time to the current time. According to the above configuration, when casually looking at the time indicated by the timepiece, it is easy to grasp a starting time for the electric power consumption and the electric power consumption at current time.

Configuration of Seventh Embodiment

Figure 20:
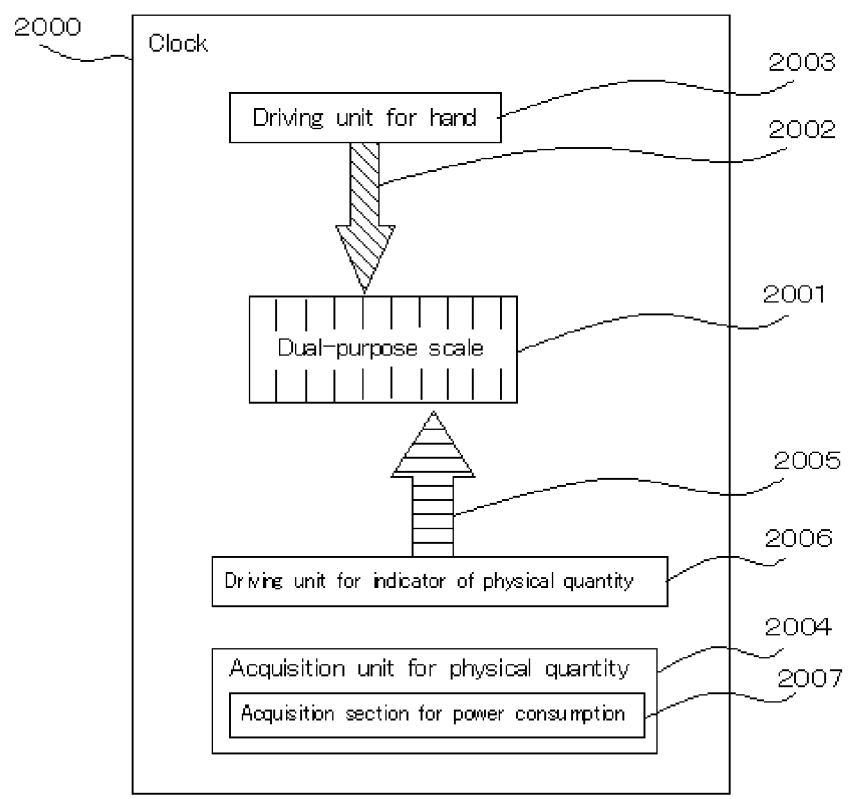
FIG. 20 is a functional block diagram of the timepiece of a seventh embodiment.

FIG. 20 is a functional block diagram of the timepiece of the seventh embodiment. As shown in FIG. 20, a 'timepiece' 2000 in the seventh embodiment comprises a 'dual-purpose scale' 2001, a 'hand' 2002, a 'driving unit for hand' 2003, an 'acquisition unit for physical quantity' 2004, an 'indicator of physical quantity' 2005, and a 'driving unit for indicator of physical quantity' 2006. The 'acquisition unit for physical quantity' further comprises an 'acquisition section for electric power consumption' 2007. Moreover, a configuration on the basis of the fourth embodiment is possible. Hereinafter, the acquisition section for electric power consumption', which is different from the first to sixth embodiments, will be described.

The 'acquisition section for electric power' is for acquiring electric power consumption from the predetermined time to current time. The information of acquired electric power consumption may be temporarily stored in a volatile memory, and may be secularly stored in the non-volatile memory.

For example, when acquiring the electric power consumption per 30 minutes, the electric power consumption from 3:00 is acquired at a predetermined interval (e.g., every 1 minute) up to 3:30, and the electric power consumption from 3:30 is acquired at a predetermined interval up to 4:00.

Moreover, the timepiece of the seventh embodiment may further comprise an acquisition unit for consumption target level for acquiring a target level for electric power consumption from the predetermined time to the current time. The target level may be acquired through wired or wireless communication line, or an internal storage.

Moreover, when acquiring electric power consumption by a predetermined time division, the target level may be acquired with respect to each predetermined time division.

For example, the target level for the electric power consumption from 3:00 to 3:30 and the target level for the electric power consumption from 3:30 to 4:00 may be respectively acquired.

The target level value may be determined on the basis of a usage history of electric power in the past. For example, with reference to the electric power consumption in the respective time division in a predetermined time period in the past (e.g., in the last two weeks), the minimum value is calculated with respect to each time division, thereby setting the target level for the respective time divisions. Moreover, average value is calculated with respect to each time division in a predetermined time period in the past, thereby setting the target level for the respective time division. Moreover, the target level may be determined with respect to each time division of each day. In this case, with reference to the electric power consumption in the respective time divisions of each day in a predetermined time period in the past (e.g., in the last month), the minimum value (average value may also be used) is calculated with respect to each time division of each day, thereby setting the target level for the respective time divisions of the respective days.

Concrete Configuration of Seventh Embodiment

The hardware configuration of the seventh embodiment is basically the same as that of the first embodiment described with reference to FIG. 5. Hereinafter, processing, which is different from those in the first to seventh embodiments, will be described.

The CPU acquires the electric power consumption up to the predetermined time and the electric power consumption up to the current time through a communication device, and stores it in the RAM. Subsequently, the CPU calculates the electric power consumption from the predetermined time to the current time, and stores it in the RAM.

Subsequently, the CPU carries out a processing of designation of the position on the dual-purpose scale pointed to by the minute hand at the predetermined time as an original position for the electric power consumption from the predetermined time to the current time. Subsequently, the CPU determines number of the luminescent elements to be lit up according to the electric power consumption from the predetermined time to the current time. Subsequently, the CPU outputs a control signal to light the determined number of the luminescent elements from the original position to the control circuit for luminescence. The control circuit for luminescence receives the control signal, and lights up the luminescent elements to be lit up.

Processing Flow of Seventh Embodiment

Figure 21:
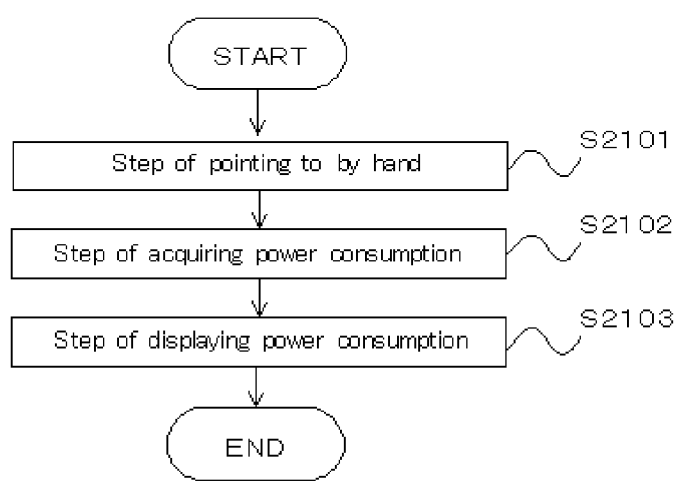
FIG. 21 is a flowchart of the timepiece of the seventh embodiment.

FIG. 21 is a flowchart of the timepiece of the seventh embodiment showing processing flow in the timepiece comprising a dual-purpose scale for indicating time and the physical quantity. The processing flow includes the following steps. At the outset, in a step S2101, a hand for pointing the dual-purpose scale according to time is driven (step of pointing by hand). Subsequently, in a step S2102, electric power consumption from the predetermined time to the current time is acquired (step of acquiring electric power consumption). In a step S2103, an indicator of physical quantity for indicating the electric power consumption from the predetermined time to the current time on the dual-purpose scale, where a position on the dual-purpose scale pointed to by the hand at the predetermined time is designated as an original position for electric power consumption from the predetermined time to the current time, is driven (step of indicating electric power consumption).

Brief Description of Effects of Seventh Embodiment

According to the above configuration of the timepiece of the seventh embodiment, when casually looking at the time indicated by the timepiece, it is easy to grasp a starting time for the electric power consumption and the electric power consumption at current time.

Eighth Embodiment

Concept of Eighth Embodiment

The timepiece of an eighth embodiment is basically same as those of the first and fourth embodiments, and acquires external information, and controls the color of the hand on the basis of the external information and the color information of hand. According to this configuration, it is possible to indicate the external information by color of the hand.

Configuration of Eighth Embodiment

Figure 22:
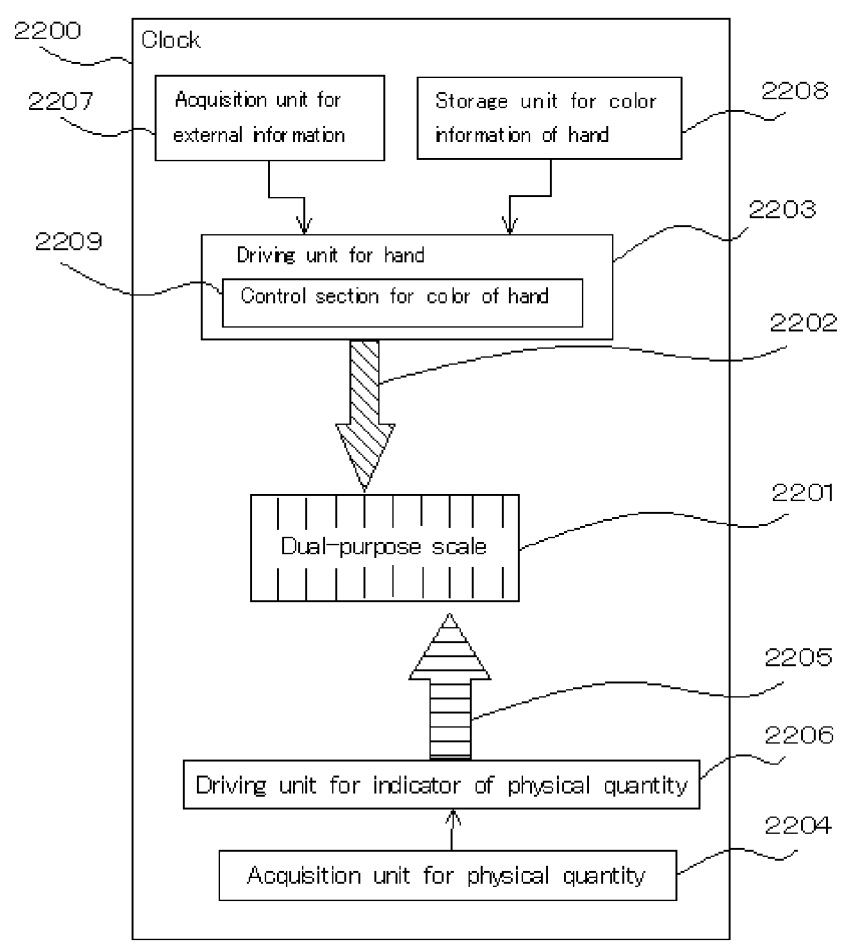
FIG. 22 is a functional block diagram of the timepiece of an eighth embodiment.

FIG. 22 is a functional block diagram of the timepiece of the eighth embodiment. As shown in FIG. 22, a 'timepiece' 2200 in the eighth embodiment comprises a 'dual-purpose scale' 2201, a 'hand' 2202, a 'driving unit for hand' 2203, a 'acquisition unit for physical quantity' 2204, an 'indicator of physical quantity' 2205, a 'driving unit for indicator of physical quantity' 2006, an 'acquisition unit for external information' 2207, and a 'storage unit for color information of hand' 2209. The 'driving unit for hand' further comprises the 'storage unit for color information of hand' 2208. Moreover, a configuration on the basis of the fourth embodiment is possible. Hereinafter, the 'acquisition unit for external information' 2207, and the 'storage unit for color information of hand' 2208, which are different from the first to seventh embodiments, will be described.

The 'acquisition unit for external information' is for acquiring external information. Here, examples of the external information include weather information such as temperature, humidity, probability of rain, amount of solar radiation, wind speed, atmospheric pressure, and wave height, electric power information such as electric power generation, sold electric power, purchased electric power, and electric power consumption, and information of working status of an electric appliance such as a television, a lighting device, and an air conditioner. Here, the external information is different from the physical quantity information acquired by the acquisition unit for physical quantity, and when the physical quantity information is the electric power consumption information, the acquisition unit for external information acquires information other than the electric power consumption information (e.g. electric power generation information).

The external information may be acquired through wired or wireless communication line, may be received through an input device, or may be acquired from an internal storage. Moreover, the acquisition of the external information includes generation of new information by processing existing information using an internal processing device.

Moreover, the type of the external information to be acquired may not be one type, and may be various types of external information. For example, the information of working status of an electric appliance may be acquired according to the weather information.

The 'storage unit for color information of hand' is for storing color information of hand, where the external information and a color of the hand are correlated. For example, the correspondence can be made by the color information of hand, when the probability of rain is below 20%, the color of hand is blue, when the probability of rain is within 20-60%, the color of hand is yellow, and when the probability of rain is above 60%, the color of hand is red.

Moreover, for example, the correspondence can be made by the color information of hand, when generating and selling the electric power, the color of hand is blue, when generating and purchasing the electric power, the color of hand is yellow, and when not generating the electric power, the color of hand is red. Note that, when acquiring various types of the external information, correspondence information of hand's color corresponding to the external information may be stored.

The 'control section for color of hand' is for controlling the color of the hand on the basis of the external information and the color information of hand.

Concrete Configuration of Eighth Embodiment

The hardware configuration of the eighth embodiment is basically the same as that of the first embodiment described with reference to FIG. 5. Hereinafter, processing, which is different from that in the first embodiment, will be described.

The CPU acquires the external information through a communication device, and stores the information in the RAM. Subsequently, the CPU reads out the information of color of hand, where the external information and a color of the hand are correlated, and stores a result in the RAM. Subsequently, the CPU determines the color of hand on the basis of the acquired external information and the information of color of hand, and stores the information in the RAM. Subsequently, the CPU outputs a signal to designate the determined color of hand to the control circuit for color of hand. The control circuit for color of hand receives the signal and controls the color of hand.

Processing Flow of Eighth Embodiment

Figure 23:
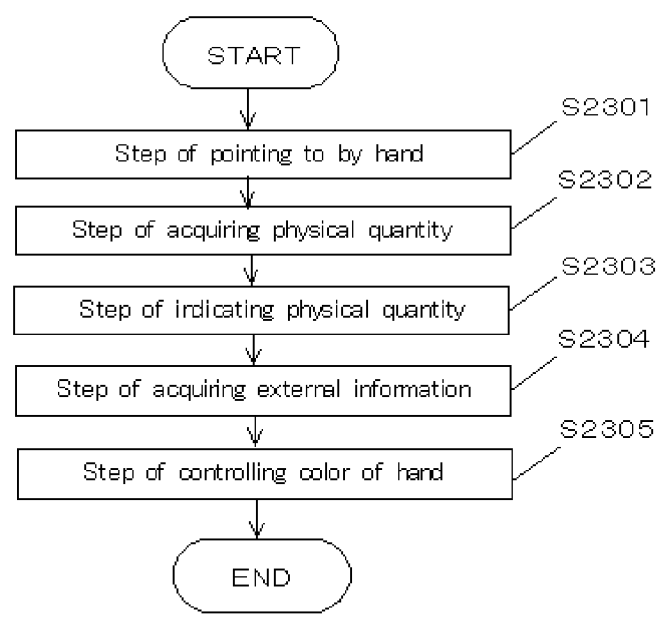
FIG. 23 is a flowchart of the timepiece of the eighth embodiment.

FIG. 23 is a flowchart of the timepiece of the eighth embodiment showing processing flow in the timepiece comprising a dual-purpose scale for indicating time and the physical quantity. The processing flow includes the following steps. At the outset, in a step S2301, a hand for pointing the dual-purpose scale according to time is driven (step of pointing by hand). Subsequently, in a step S2302, physical quantity from a predetermined time is acquired (step of acquiring physical quantity). In a step S2303, an indicator of physical quantity for indicating the acquired physical quantity on the dual-purpose scale, where a position on the dual-purpose scale pointed to by the hand at the predetermined time is designated as an original position for the physical quantity, is driven (step of indicating physical quantity). In a step S2304, external information is acquired (step of acquiring external information). In a step S2305, the color of hand is controlled on the basis of the external information and the information of color of hand, where the external information and the color of the hand are correlated (step of controlling color of hand). Moreover, a processing on the basis of the fourth embodiment is possible.

Brief Description of Effects of Eighth Embodiment

According to the above configuration of the timepiece of the eighth embodiment, in addition to the effects of the first and fourth embodiments, it is possible to indicate the external information by the color of hand.

Ninth Embodiment

Concept of Ninth Embodiment

In a ninth embodiment, the above first to eighth embodiments are summarized in order to easily understand the inventions of aspects 10 to 12, 15 and 16. Note that additional components described in the ninth embodiment are applicable to the corresponding configurations in the first to eighth embodiments.

Configuration of Ninth Embodiment

Figure 24:
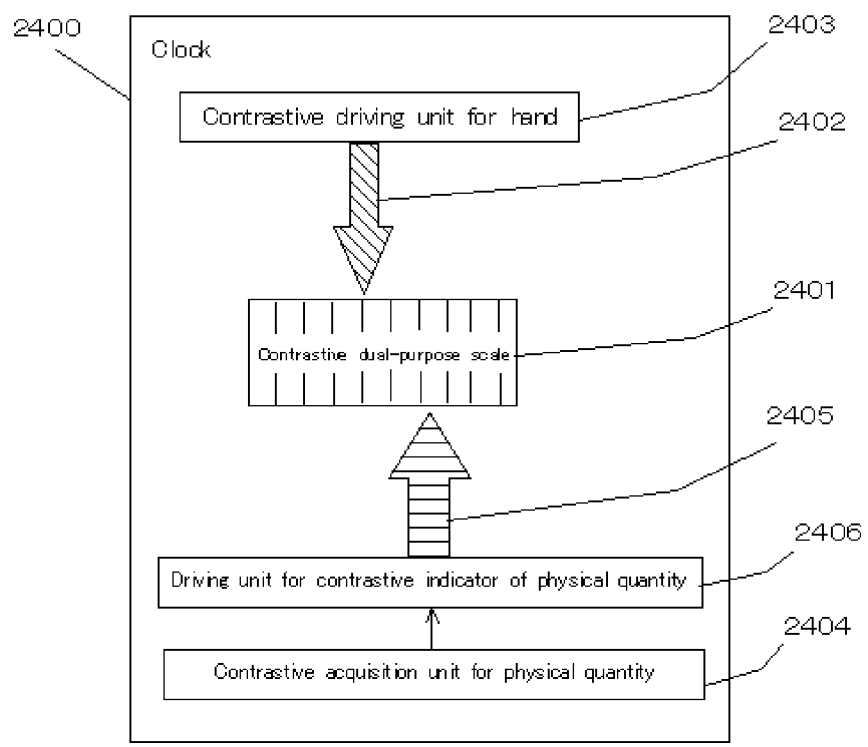
FIG. 24 is a functional block diagram of the timepiece of a ninth embodiment.

FIG. 24 is a functional block diagram of the timepiece of the ninth embodiment. As shown in FIG. 24, a 'timepiece' 2400 in the ninth embodiment comprises a 'contrastive dual-purpose scale' 2401, a 'hand' 2402, a 'contrastive driving unit for hand' 2403, a 'contrastive acquisition unit for physical quantity' 2404, a 'contrastive indicator of physical quantity' 2405, and a 'contrastive driving unit for indicator of physical quantity' 2406.

The 'contrastive dual-purpose scale' is for indicating time and a below-mentioned physical quantity for a target level. The contrastive dual-purpose scale corresponds to the dual-purpose scale of the first and second embodiments etc. It is mainly assumed that the contrastive dual-purpose scale is indicated on the dial plate of the timepiece, and when the dial plate has a display function, the contrastive dual-purpose scale may be indicated through the display.

The 'contrastive driving unit for hand' is for driving a hand for pointing the contrastive dual-purpose scale according to time. The contrastive driving unit for hand corresponds to the driving unit for hand of the first and second embodiments etc. As a concrete means for driving the hand according to time, as described in the first embodiment, it is assumed that a control signal is transmitted to the control circuit for hand at a predetermined timing on the basis of the signal from the crystal oscillator, and the control circuit for hand receives the control signal, thereby controlling the hand through the driving mechanism for hand.

Note that the current time information can be acquired by counting signals from the crystal oscillator using a timer in the processing operation apparatus, and not limited to this example. For example, like a general radio timepiece, it is possible to acquire time information by receiving radio signal of a predetermined frequency through communication method. Moreover, the time information may be received from an external device through Internet line or wire of wireless LAN. The current time information is used for the contrastive acquisition unit for physical quantity and the contrastive indicator of physical quantity.

The 'acquisition unit for target level' is for acquiring a target level for the physical quantity in a time division by predetermined time unit. As described in the second embodiment, the target level for the physical quantity may be preliminarily stored in an internal storage, may be acquired from an external device through wired or wireless communication line, may be received as an input though an operation input device, or may be acquired through a storage device such as a USB memory. Moreover, calculation of a target level for physical quantity at one time on the basis of a target level for physical quantity at other time is included as the acquisition of target level. Therefore, the acquisition unit for target level comprises a storage section for receiving an input of the target level for physical quantity in a time division by a predetermined time unit from the communication line or input device, and storing the information (storage section for input).

Specifically, the acquisition unit for target level acquires starting time and ending time of acquiring the physical quantity (or interval from the starting time) through the input device or the communication device, and the target level value in the time division defined by the starting time and ending time through the input device or the communication device. Note that the target level value may be calculated on the basis of the minimum, maximum, and average values of the physical quantity in the past.

FIG. 25 is a diagram showing target level information to be acquired by an acquisition unit for target level. In FIG. 25, the target level information is expressed by a table, where the respective time divisions of 30 minutes and the target level in the time division are correlated. The contrastive acquisition unit for physical quantity and the contrastive indicator of physical quantity can determine the starting time and ending time of the respective time divisions from the target level information, and can acquire the target level value for physical quantity in the respective time division. Moreover, as to the time unit of the respective time divisions, any interval such as 15 minutes or 20 minutes other than 30 minutes can be designated. Moreover, the number of the time divisions by the predetermined time unit may not be multiple, and may be one.

The 'contrastive acquisition unit for physical quantity' has a function of acquiring the physical quantity from starting time of the time division including current time to the current time at predetermined interval up to ending time of the time division including the current time. The contrastive acquisition unit for physical quantity corresponds to the acquisition unit for physical quantity in the first and second embodiments etc. As described in the sixth embodiment, the contrastive acquisition unit for physical quantity can acquire the electric power consumption from starting time to current time in the time division including the current time at a predetermined interval up to ending time in the time division including the current time.

Similar to the acquisition unit for physical quantity described in the first embodiment, the contrastive acquisition unit for physical quantity may comprise an acquisition section for the electric power consumption, electric power generated, sold electric power, and purchased electric power (acquisition section for electric power). Moreover, any quantity from the starting time of the respective time division can be used for the physical quantity to be acquired by the contrastive acquisition unit for physical quantity, and examples thereof include running distance from starting time of the time division, swimming distance from starting time of the time division, number of steps from starting time of the time division, number of push-ups from starting time of the time division, or number of squats from starting time of the time division.

Moreover, as described in the first embodiment, the acquisition unit for physical quantity may directly acquire the physical quantity data from a detector, may indirectly acquire the physical quantity data from an external device for acquiring it from the detector through wired or wireless communication means, or may acquire the data through an input device.

Moreover, the physical quantity may be consumption of water or gas, or value acquired by subtracting the electric power generation from the electric power consumption. In this case, the 'contrastive acquisition unit for physical quantity' can acquire the consumption of water or gas, or value acquired by subtracting the electric power generation from the electric power consumption from starting time of the time division including current time to the current time at predetermined interval up to ending time of the time division including the current time. Moreover, the physical quantity may be price value calculated by multiplying the electric power consumption, electric power generated, sold electric power or purchased electric power, or the consumption of water or gas by unit price. The information of unit price may be correlated with the time slot, and may be preliminarily stored in an internal storage, may be acquired from an external device through wired or wireless communication line, may be received as an input though an operation input device, or may be acquired through a storage device such as a USB memory.

The information of the time division defining the starting time and the ending time for acquiring the physical quantity, or information of the predetermined interval time for acquiring the physical quantity may be acquired from an external device through wired or wireless communication line, may be received as an input through an operation input device, or may be acquired through a storage device such as a USB memory.

By utilizing the time division information, the predetermined interval information, and the time information, it is possible to acquire the physical quantity from starting time of the time division including current time to the current time at predetermined interval up to ending time of the time division including the current time.

The 'contrastive indicator of physical quantity' has a function of indicating the physical quantity contrasted with the target level at the current time on the contrastive dual-purpose scale, the physical quantity acquired by the contrastive acquisition unit for physical quantity. The contrastive indicator of physical quantity corresponds to the indicator of physical quantity described in the first and second embodiments etc. As described in the second embodiment, the acquired physical quantity can be easily understood by contrasting with the target level. Moreover, by making correspondence between the target level for the physical quantity at the current time and the position on the dual-purpose scale pointed to by the hand, it is possible to immediately grasp the physical quantity at current time contrasted with the target level by contrasting the hand and the indicator of physical quantity.

Moreover, it is possible to control the color of the contrastive indicator of physical quantity according to the physical quantity contrasted with the target level. For example, when the proportion for the target level is 0-60%, the color of the contrastive indicator of physical quantity is blue, when the proportion for the target level is 60-80%, the color of the contrastive indicator of physical quantity is green, when the proportion for the target level is 80-100%, the color of the contrastive indicator of physical quantity is orange, and when the proportion for the target level is above 100%, the color of the contrastive indicator of physical quantity is red. This control is carried out on the basis of a table, where the physical quantity contrasted with the target level and the color of the contrastive indicator of physical quantity are correlated. Moreover, when the physical quantity contrasted with the target level goes over the circuit of the contrastive dual-purpose scale, the color of the contrastive indicator of physical quantity remains red. Moreover, by using the other color, it is possible to indicate that the contrastive indicator of physical quantity goes over the second circuit. This applies to the case that the contrastive indicator of physical quantity goes over more than or equal to the third circuit.

Moreover, it is possible to output sound from an audio output device according to the physical quantity contrasted with the target level. This is possible by storing a table data, where the physical quantity contrasted with the target level and the sound data to be outputted from the audio output device are correlated. For example, when the proportion of the physical quantity contrasted with the target level is 0-80%, the sound is not outputted, when the proportion of the physical quantity contrasted with the target level is 80-100%, the sound to inform of a possible excess of the target level is outputted, and when the proportion of the physical quantity contrasted with the target level is above 100%, the sound to inform of an excess of the target level is not outputted. Moreover, a tempo of the sound may be faster, and volume thereof may be increased, as the physical quantity contrasted with the target level increases.

The 'driving unit for contrastive indicator of physical quantity' has a function of driving the contrastive indicator of physical quantity, where a position on the contrastive dual-purpose scale pointed to by the hand at the starting time of the time division including the current time is designated as an original position for the physical quantity contrasted with the target level, and where a position on the contrastive dual-purpose scale pointed to by the hand at the current time is designated as a position for the target level for the physical quantity at the current time. The driving unit for contrastive indicator of physical quantity corresponds to the driving unit for indicator of physical quantity described in the first and second embodiments etc. As described in the second embodiment, the driving unit for contrastive indicator of physical quantity drives the contrastive indicator of physical quantity on the basis of the original position for the physical quantity, the position on the contrastive dual-purpose scale pointed to by the hand at the current time, and the proportion of the physical quantity at the current time contrasted with the target level.

(Luminescent Element: Count Up Mode)

As described in the first and second embodiments and FIG. 7, by utilizing the 'contrastive indicator of physical quantity' as the luminescent elements arranged corresponding to the respective scale marks on the contrastive dual-purpose scale, the 'driving unit for contrastive indicator of physical quantity' can light up the luminescent elements from the original position to the position for the physical quantity contrasted with the target level at the current time.

(Luminescent Element: Countdown Mode)

Figure 26:
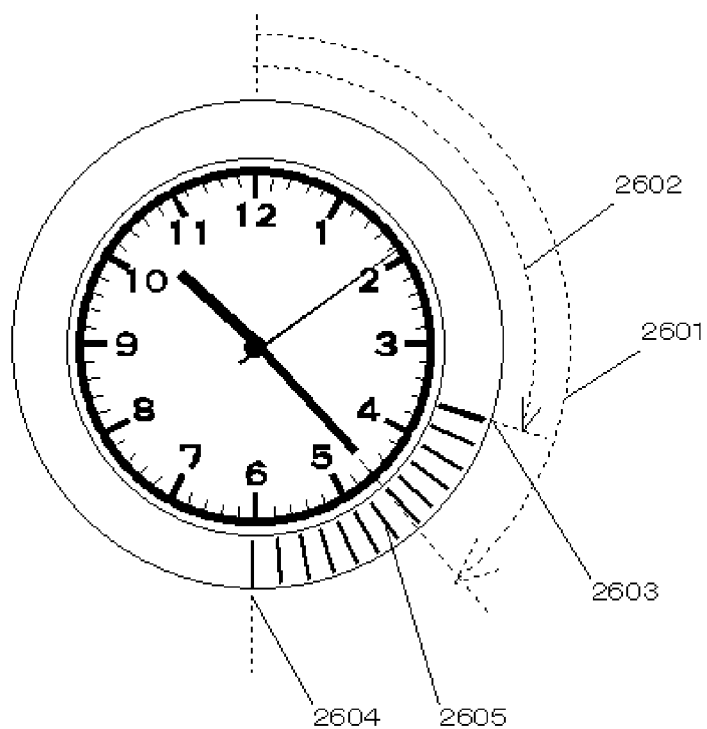
FIG. 26 is a diagram showing an example of the timepiece of the ninth embodiment.

As shown in FIG. 26, the 'driving unit for contrastive indicator of physical quantity' can light up the 'luminescent elements' (2605) from the 'position for the physical quantity (2602) contrasted with the target level (2601) at the current time' 2603 to the 'position on the contrastive dual-purpose scale pointed to by the hand at the ending time of the time division including the current time' (2604).

Concrete Configuration of Ninth Embodiment

The hardware configuration of the ninth embodiment is basically the same as that of the first embodiment described with reference to FIG. 5.

The CPU transmits a control signal to the control circuit for hand at a predetermined timing on the basis of the signal from the crystal oscillator. The control circuit for hand receives the control signal, thereby controlling the hand through the driving mechanism for hand. Subsequently, the CPU periodically receives the information of radio timepiece though a communication device (e.g., 6 times a day), and appropriately updates the time information stored in the RAM, thereby adjusting the hand position. Note that, when not receiving the radio timepiece information, the CPU updates the time information by utilizing a timer.

The CPU reads out the target level data for the electric power consumption correlated with the respective time division of 20 minutes stored in the non-volatile memory on the RAM. Subsequently, the target level for the electric power consumption at the current time is calculated in the basis of the target level data of the time division including the current time. For example, when the target level of the electric power consumption from 6:00 to 6:20 is 40 kWh, it is possible to calculate that a target level at 6:10 is 20 kWh.

The CPU receives the electric power consumption from the starting time of the time division including the current time to the current time from an external device through a communication device. This reception is carried out at every minute in the first half of 10 minutes, and is carried out at every 30 minutes in the second half of 10 minutes.

Subsequently, the CPU calculates the proportion of the electric power consumption from the starting time to the current time contrasted with the target level at the current time, and stores it in the RAM.

Subsequently, the CPU carries out a processing, where a position on the contrastive dual-purpose scale pointed to by the minute hand at the starting time of the time division including the current time is designated as the original position for the electric power consumption contrasted with the target level, and where the position on the contrastive dual-purpose scale pointed to by the minute hand at the ending time of the time division including the current time is designated as the position for the target level for the electric power consumption at the ending time of the time division including the current time. Specifically, the position on the contrastive dual-purpose scale pointed to by the minute hand at 6:00 (position of 0 minute) is designated as the original position for the electric power consumption contrasted with the target level, and the position on the contrastive dual-purpose scale pointed to by the minute hand at 6:10 (position of 10 minutes) is designated as the position for the target level for the electric power consumption at 6:10.

Subsequently, the CPU determines number of the luminescent elements to be lit up according to the electric power consumption at the current time on the basis of the original position and the position for the target level. Specifically, when the electric power consumption from 6:00 to 6:10 is 8 kWh, the number of the luminescent elements to be lit up is 8. Subsequently, the CPU outputs a control signal to light the determined number of the luminescent elements from the original position to the control circuit for luminescence. The control circuit for luminescence receives the control signal, and lights up the luminescent elements to be lit up.

Processing Flow of Ninth Embodiment

Figure 27:
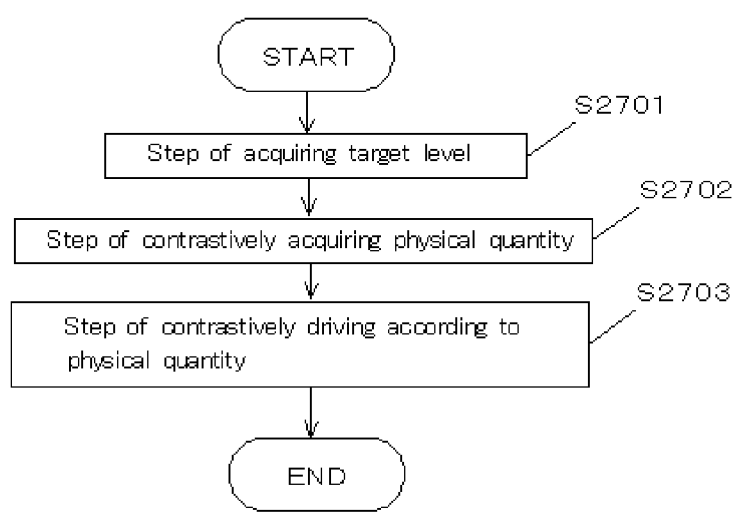
FIG. 27 is a flowchart of the timepiece of the ninth embodiment.

FIG. 27 is a flowchart of the timepiece of the ninth embodiment showing processing flow in the timepiece comprising the contrastive dual-purpose scale for indicating time and the below-mentioned physical quantity for a target level, and driving the hand for pointing the contrastive dual-purpose scale according to time, a dual-purpose scale for indicating time and the physical quantity. The processing flow includes the following steps. At the outset, in a step S2701, a target level for the physical quantity in a time division by predetermined time unit is acquired (step of acquiring target level). In a step S2702, the physical quantity from starting time of the time division including current time to the current time is acquired at predetermined interval up to ending time of the time division including the current time (step of contrastively acquiring physical quantity). In a step S2703, the contrastive indicator of physical quantity is driven, where a position on the contrastive dual-purpose scale pointed to by the hand at the starting time of the time division including the current time is designated as an original position for the physical quantity contrasted with the target level, and where a position on the contrastive dual-purpose scale pointed to by the hand at the ending time of the time division including the current time is designated as a position for the target level for the physical quantity at the ending time of the time division including the current time (step of contrastively driving according to physical quantity).

Brief Description of Effects of Ninth Embodiment

According to the above configuration of the timepiece of the ninth embodiment, it is easy to grasp the physical quantity at the current time contrasted with the target level at the current time.

Tenth Embodiment

Concept of Tenth Embodiment

In a tenth embodiment, the above first to eighth embodiments are summarized in order to easily understand the inventions of aspects 13 to 16. Note that additional components described in the tenth embodiment are applicable to the corresponding configurations in the first to eighth embodiments.

Configuration of Tenth Embodiment

Figure 28:
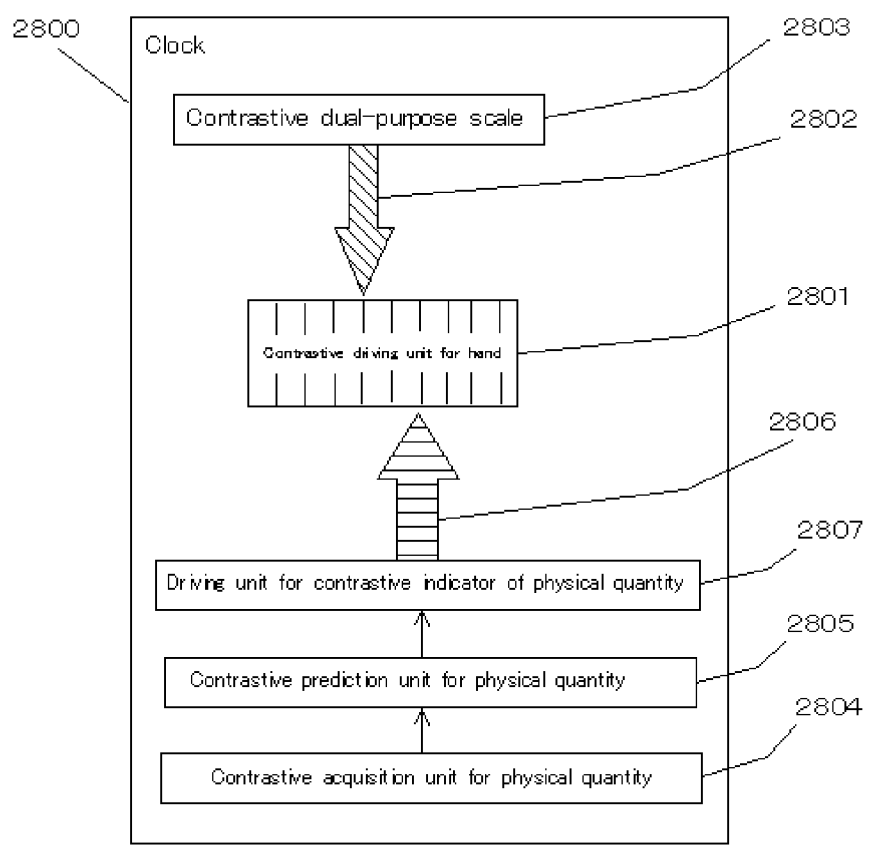
FIG. 28 is a functional block diagram of a timepiece of a tenth embodiment.

FIG. 28 is a functional block diagram of the timepiece of the tenth embodiment. As shown in FIG. 28, a 'timepiece' 2800 in the tenth embodiment comprises a 'contrastive dual-purpose scale' 2801, a 'hand' 2802, a 'contrastive driving unit for hand' 2803, a 'contrastive acquisition unit for physical quantity' 2804, a 'contrastive prediction unit for physical quantity' 2805, an 'contrastive indicator of predicted physical quantity' 2806, and a 'contrastive driving unit for indicator of predicted physical quantity' 2807.

The 'contrastive prediction unit for physical quantity' has a function of predicting the physical quantity at ending time of the time division including the current time on a basis of the physical quantity acquired by the contrastive acquisition unit for physical quantity. The contrastive prediction unit for physical quantity corresponds to the prediction unit for physical quantity described in the fourth embodiment etc.

(Average Prediction Mode)

Specifically, as described in the fourth embodiment, fitting of the physical quantity data from the starting time of the time division including the current time to the current time by linear function is carried out, thereby predicting the physical quantity at the ending time. For example, when electric power of 5 kWh is generated from 3:00 to 3:15, fitting by the linear function is carried out, and it is predicted that 10 kWh electric power is generated until 3:30.

(Instant Prediction Mode)

Moreover, it is possible to predict the physical quantity at the ending time of the time division on the basis of variation (differential) of the physical quantity per unit time (e.g., 1 minute or 2 minutes). For example, when electric power of 5 kWh is consumed (or generated) from 3:00 to 3:15, and when electric power of 0.5 kWh is consumed (or generated) from 3:14 to 3:15, it is predicted that 7.5 kWh (0.5 kWh×15) electric power is newly consumed (or generated) from 3:15 to 3:30, and that 12.5 kWh electric power is consumed (or generated) in the entire time division. Moreover, the unit time value may not be fixed value, and may be varied to be a smaller value as the ending time of the time division gets closer. For example, the unit time is 5 minutes from the starting time to the ⅓ of the time division, is 3 minutes from the ⅓ to the ⅔ of the time division, and is 1 minute from the ⅔ to the ending time of the time division. Thus, by varying the unit time to a smaller value as the ending time of the time division gets closer, it is possible to accurately predict the physical quantity at the ending time with good balance with processing load.

The contrastive indicator of predicted physical quantity, indicating the predicted physical quantity contrasted with the target level at the ending time of the time division including the current time on the contrastive dual-purpose scale, the physical quantity predicted by the contrastive prediction unit for physical quantity. The contrastive indicator of predicted physical quantity corresponds to the indicator of predicted physical quantity described in the fourth and fifth embodiments etc. As described in the fifth embodiment, the predicted physical quantity can be easily understood by contrasting with the target level at the ending time. Moreover, by making correspondence between the target level for the physical quantity at ending the time and the position on the contrastive dual-purpose scale pointed to by the hand at the ending time, it is possible to immediately grasp the predicted physical quantity at the ending time contrasted with the target level by contrasting the position on the contrastive dual-purpose scale with the contrastive indicator of predicted physical quantity.

The 'driving unit for contrastive indicator of predicted physical quantity' has a function of driving the contrastive indicator of predicted physical quantity, where a position on the contrastive dual-purpose scale pointed to by the hand at the starting time of the time division including the current time is designated as an original position for the physical quantity contrasted with the target level, and where a position on the contrastive dual-purpose scale pointed to by the hand at the ending time of the time division including the current time is designated as a position for the target level for the physical quantity at the ending time of the time division including the current time. The 'driving unit for contrastive indicator of predicted physical quantity' corresponds to the driving unit for indicator of predicted physical quantity described in the fourth and fifth embodiments etc. As described in the fifth embodiment, the driving unit for contrastive indicator of predicted physical quantity drives the contrastive indicator of predicted physical quantity on the basis of the original position for the physical quantity, the position on the contrastive dual-purpose scale pointed to by the hand at the ending time, and the proportion of the physical quantity at the ending time contrasted with the target level.

(Luminescent Element: Count Up Mode)

By utilizing the 'contrastive indicator of predicted physical quantity' as the luminescent elements arranged corresponding to the respective scale marks on the contrastive dual-purpose scale, the 'driving unit for contrastive indicator of predicted physical quantity' can light up the luminescent elements from the original position to the position of the predicted physical quantity at the ending time of the time division including the current time contrasted with the target level. This has been described in the fifth embodiment and FIG. 15 as the explanation of the driving unit for indicator of predicted physical quantity.

Figure 29:
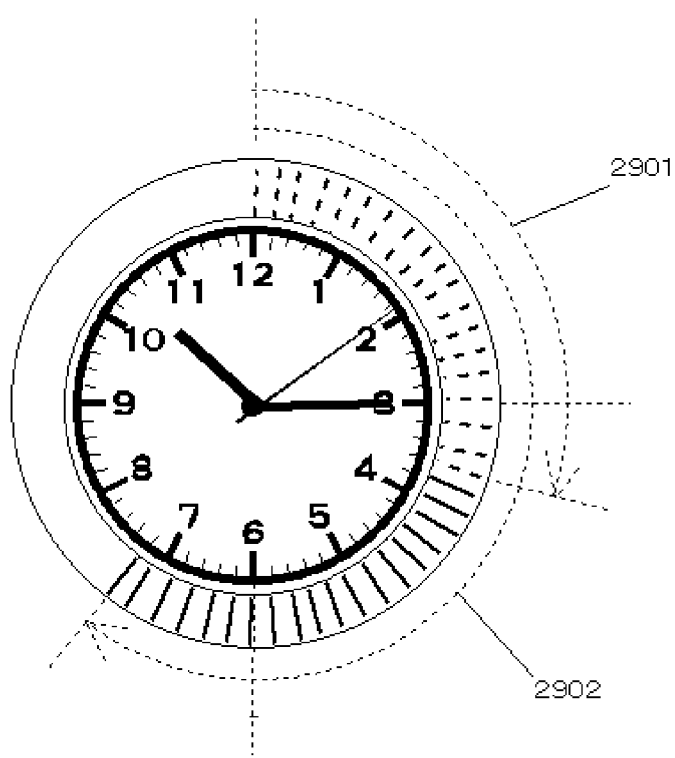
FIG. 29 is a diagram showing other timepiece 1 of the tenth embodiment.

Moreover, by further comprising the contrastive indicator of physical quantity and the contrastive driving unit for indicator of physical quantity, described in the ninth embodiment, as shown in FIG. 29, it is possible to simultaneously indicate both a 'physical quantity contrasted with a target level at current time' 2901, and a 'physical quantity contrasted with a target level at ending time' 2902 on the contrastive dual-purpose scale. In the case of FIG. 29, since a 'scope on contrastive indicator of physical quantity', where the 'physical quantity contrasted with the target level at the current time' 2901 is indicated by the contrastive indicator of physical quantity, partially overlaps with a 'scope on contrastive indicator of physical quantity', where the 'physical quantity contrasted with the target level at the ending time' 2902 is indicated by the contrastive indicator of physical quantity, the overlapping portion (physical quantity contrasted with the target level at the current time) is indicated by using an indication method (e.g. color, lighting up/blinking, brightness and design), which is different from that of the other portion.

Figure 30:
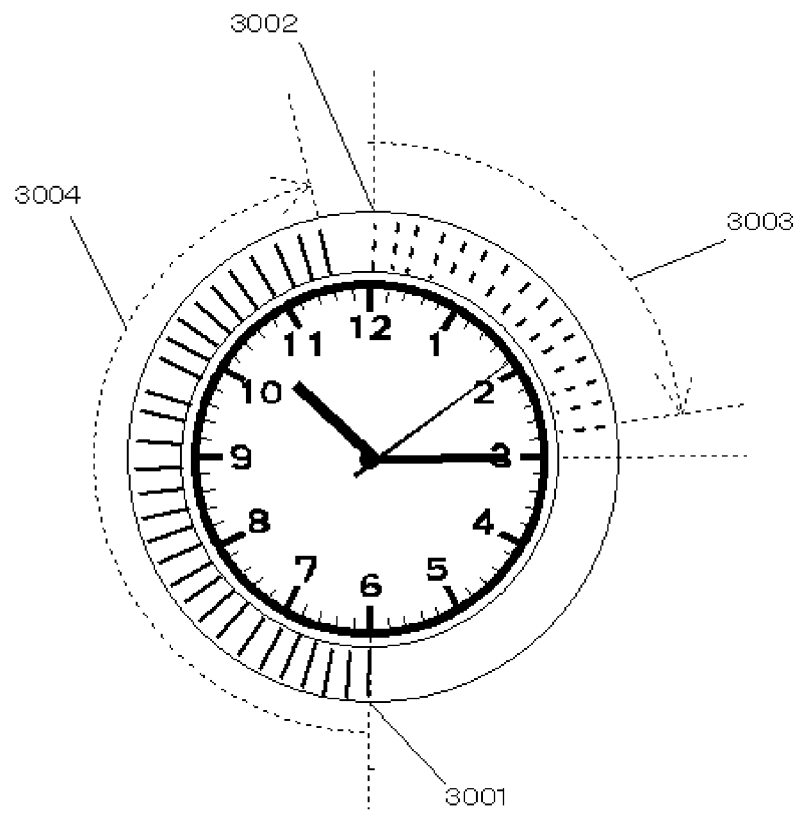
FIG. 30 is a diagram showing other timepiece 2 of the tenth embodiment.

Moreover, as another example, as shown in FIG. 30, the driving unit for contrastive indicator of physical quantity drives the contrastive indicator of physical quantity, where a 'position on the contrastive dual-purpose scale pointed to by the hand at the ending time of the time division including the current time' 3001 is designated as an original position for the predicted physical quantity contrasted with the target level, and where a 'position on the contrastive dual-purpose scale pointed to by the hand at time after the time passage equal to the time division after the ending time of the time division including the current time is designated as a position for the target level for the physical quantity at the ending time of the time division including the current time' 3002 is designated as the target level for the predicted physical quantity. Moreover, in the case of FIG. 30, the indication methods (e.g. color, lighting up/blinking, brightness and design) for the contrastive indicator of physical quantity and the contrastive indicator of predicted physical quantity are different from each other, thereby providing distinguishability even if the scope of the indicators overlap with each other.

Concrete Configuration of Tenth Embodiment

The hardware configuration of the tenth embodiment is basically the same as that of the first embodiment described with reference to FIG. 5.

The CPU transmits a control signal to the control circuit for hand at a predetermined timing on the basis of the signal from the crystal oscillator. The control circuit for hand receives the control signal, thereby controlling the hand through the driving mechanism for hand. Subsequently, the CPU periodically receives the information of radio timepiece though a communication device (e.g., 6 times a day), and appropriately updates the time information stored in the RAM, thereby adjusting the hand position. Note that, when not receiving the radio timepiece information, the CPU updates the time information by utilizing a timer.

The CPU reads out the target level data for the electric power consumption correlated with the respective time division of 3 hours stored in the non-volatile memory on the RAM.

Subsequently, the CPU acquires the target level value for the electric power consumption at the ending time of the time division including the current time from the data. Specifically, when the target level for the electric power consumption at the current time (13:10) in the time division from 12:00 to 15:00 is 60 kWh, the value of 60 kWh is acquired.

The CPU receives the electric power generation from the starting time of the time division including the current time to the current time from an external device through a communication device. This reception is carried out every five minutes in the first half of an hour, and is carried out at every two minutes in the second half of an hour and a half. Subsequently, the CPU calculates the predicted electric power consumption from the starting time to the ending time on the basis of the acquired electric power generation data. Subsequently, the CPU calculates the proportion of the calculated value of the predicted electric power consumption contrasted with the target level value at the ending time, and stores a result in the RAM.

Subsequently, the CPU carries out a processing, where a position on the contrastive dual-purpose scale pointed to by the hour hand at the starting time of the time division including the current time is designated as the original position for the predicted electric power generation contrasted with the target level, and where the position on the contrastive dual-purpose scale pointed to by the hour hand at the ending time of the time division including the current time is designated as the position for the target level for the predicted electric power generation at the ending time of the time division including the current time. Specifically, the position on the contrastive dual-purpose scale pointed to by the hour hand at 12:00 (position of 12:00) is designated as the original position for the predicted electric power generation contrasted with the target level, and the position on the contrastive dual-purpose scale pointed to by the hour hand at 15:00 (position of 15:00) is designated as the position for the target level for the predicted electric power generation at the ending time.

Subsequently, the CPU determines number of the luminescent elements to be lit up according to the predicted electric power generation on the basis of the original position and the position for the target level. Specifically, when the predicted electric power generation from the starting time 12:00 to the ending time 15:00 is 120 kWh, the number of the luminescent elements to be lit up is 30 (15×120/60). Subsequently, the CPU outputs a control signal to light the determined number of the luminescent elements from the original position to the control circuit for luminescence. The control circuit for luminescence receives the control signal, and lights up the luminescent elements to be lit up.

Processing Flow of Tenth Embodiment

Figure 31:
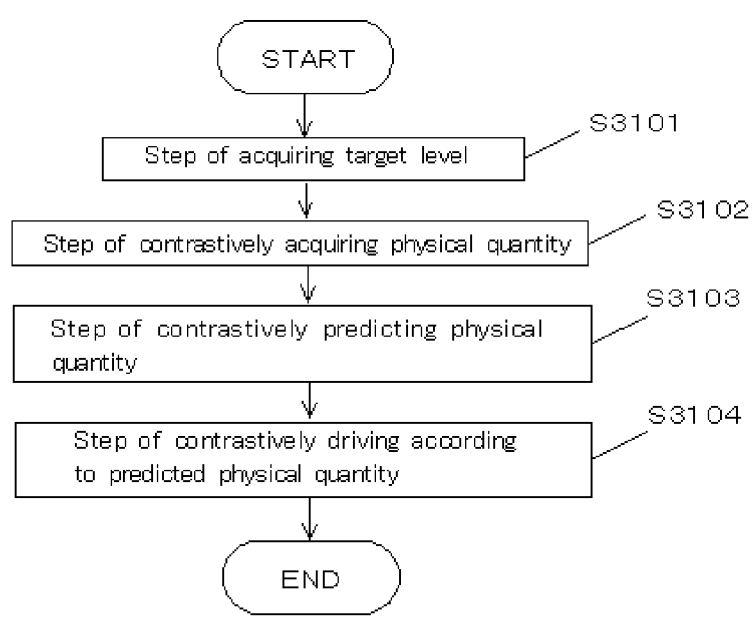
FIG. 31 is a flowchart of the timepiece of the tenth embodiment.

FIG. 31 is a flowchart of the timepiece of the tenth embodiment showing processing flow in the timepiece comprising the contrastive dual-purpose scale for indicating time and the below-mentioned physical quantity for a target level, and driving the hand for pointing the contrastive dual-purpose scale according to time, a dual-purpose scale for indicating time and the physical quantity. The processing flow includes the following steps. At the outset, in a step S3101, a target level for the physical quantity in a time division by predetermined time unit is acquired (step of acquiring target level). In a step S3102, the physical quantity from starting time of the time division including current time to the current time is acquired at predetermined interval up to ending time of the time division including the current time (step of contrastively acquiring physical quantity). In a step S3103, the physical quantity at the ending time of the time division including the current time is predicted on the basis of the acquired physical quantity. In a step S3104, the contrastive indicator of predicted physical quantity for indicating the predicted physical quantity contrasted with the target level at the ending time of the time division including the current time on the contrastive dual-purpose scale is driven, where a position on the contrastive dual-purpose scale pointed to by the hand at the starting time of the time division including the current time is designated as an original position for the physical quantity contrasted with the target level, and where a position on the contrastive dual-purpose scale pointed to by the hand at the ending time of the time division including the current time is designated as a position for the target level for the physical quantity at the ending time of the time division including the current time (step of contrastively driving according to predicted physical quantity).

Brief Description of Effects of Tenth Embodiment

According to the above configuration of the timepiece of the tenth embodiment, it is easy to grasp the predicted physical quantity at the ending time of the time division including the current time contrasted with the target level.

DESCRIPTION OF REFERENCE NUMERALS

0200 Timepiece
0201 Dual-purpose scale
0202 Hand
0203 Driving unit for hand
0204 Acquisition unit for physical quantity
0205 Indicator of physical quantity
0206 Driving unit for indicator of physical quantity
0501 CPU
0502 RAM
0503 ROM
0504 non-volatile memory
0505 Crystal oscillator
0506 Control circuit for hand
0507 Driving mechanism for hand
0508 Control circuit for luminescence
0509 luminescent device
0510 Communication device
0511 System bus
0807 First driving section
1008 First determination section
1009 First color control section
1305 Prediction unit for physical quantity
1306 Indicator of predicted physical quantity
1307 Driving unit for indicator of predicted quantity
1608 Second driving section
1808 Second determination section
1809 Second color control section
2007 Acquisition section for electric power consumption
2207 Acquisition unit for external information
2208 Storage unit for color information of hand
2209 Control section for color of hand
2401 Contrastive dual-purpose scale
2402 Hand
2403 Contrastive driving unit for hand
2404 Contrastive acquisition unit for physical quantity
2405 Contrastive indicator of physical quantity
2406 Driving unit for contrastive indicator of physical quantity
2806 Contrastive indicator of predicted physical quantity
2807 Driving unit for contrastive indicator of predicted physical quantity

What is claimed is:

1. A timepiece comprising:
a dual-purpose scale, indicating time and a physical quantity;
a hand driving unit for driving a hand for pointing to time on the dual-purpose scale;
a physical quantity acquisition unit for acquiring information of the physical quantity from a starting time; and
a physical quantity driving unit for driving a physical quantity indicator for indicating the acquired physical quantity on the dual-purpose scale,
wherein the physical quantity driving unit determines an original position as a position on the dual-purpose scale pointed to by the hand at the starting time and drives the physical quantity indicator on the dual purpose scale from the determined original position.

2. The timepiece according to claim 1, comprising:
a first driving section, driving the indicator of physical quantity at a proportion, where a position on the dual-purpose scale pointed to by the hand at current time indicates a target level for the physical quantity at the current time.

3. The timepiece according to claim 2, wherein the driving unit for indicator of physical quantity further comprises:
a first determination section, determining whether a position indicated by the indicator of physical quantity is larger than the position on the dual-purpose scale for indicating the target level; and
a first color control section, controlling color of the indicator of physical quantity according to the determination by the first determination section.

4. The timepiece according to claim 1, wherein the acquisition unit for physical quantity comprises an acquisition section for electric power consumption, acquiring electric power consumption from the predetermined time to current time.

5. The timepiece according to claim 1, further comprising:
an acquisition unit for external information, acquiring external information; and
a storage unit for color information of the hand, storing color information of the hand, where the external information and a color of the hand are correlated,
wherein the driving unit for the hand further comprises a control section for color of the hand, controlling the color of the hand on the basis of the external information and the color information of the hand.

6. The timepiece according to claim 1, wherein the hand is a minute hand.

* * * * *